US005805583A

United States Patent [19]

Rakib

[11] Patent Number: 5,805,583

[45] Date of Patent: Sep. 8, 1998

[54] PROCESS FOR COMMUNICATING MULTIPLE CHANNELS OF DIGITAL DATA IN DISTRIBUTED SYSTEMS USING SYNCHRONOUS CODE DIVISION MULTIPLE ACCESS

[75] Inventor: Selim Shlomo Rakib, Cupertino, Calif.

[73] Assignee: Terayon Communication Systems, Santa Clara, Calif.

[21] Appl. No.: 519,509

[22] Filed: Aug. 25, 1995

[51] Int. Cl.$^6$ .................... H04B 7/216

[52] U.S. Cl. .................... 370/342; 370/335; 370/347; 370/441; 370/479; 375/261; 375/298; 375/358

[58] Field of Search .................... 370/335, 342, 370/206, 347, 470, 350, 441, 503, 330, 337, 479; 375/354, 356, 200, 202, 358, 516, 292, 261, 298, 324

[56] References Cited

U.S. PATENT DOCUMENTS

| | | | |
|---|---|---|---|
| 4,460,992 | 7/1984 | Gutleber | 370/441 |
| 4,470,138 | 9/1984 | Gutleber | 370/342 |
| 4,475,208 | 10/1984 | Ricketts | 375/200 |
| 4,553,161 | 11/1985 | Citta | 348/10 |
| 4,554,579 | 11/1985 | Citta | 348/10 |
| 4,635,274 | 1/1987 | Kubota | 375/200 |
| 4,688,210 | 8/1987 | Eizenhofer et al. | 370/335 |
| 4,723,164 | 2/1988 | Nienaber | 348/495 |
| 4,748,681 | 5/1988 | Schmidt | 455/517 |
| 4,757,468 | 7/1988 | Bione et al. | 364/514 C |
| 4,773,066 | 9/1988 | Kirkman et al. | 370/445 |
| 4,811,365 | 3/1989 | Manno | 375/356 |

(List continued on next page.)

FOREIGN PATENT DOCUMENTS

| | | |
|---|---|---|
| PCT/US95/04329 | 10/1995 | WIPO . |
| PCT/US95/10899 | 3/1996 | WIPO . |

OTHER PUBLICATIONS

R. De Gaudenzi et al., "Performance Evaluation of Quasi–Synchronous Code Division Multiple Access (QS–CDMA) for Satellite Mobile Systems," Globecom '90: IEEE Global Telecommunications Conference, 1800–1804, Apr. 1990.

R. Lupas et al., "Linear Multiuser Detectors for Synchronous Code Division Multiple Access Channels," IEEE Transactions on Information Theory, vol. 35, Issue 1, pp. 123–136, Jan. 1989.

*Primary Examiner*—Wellington Chin
*Assistant Examiner*—Melissa Kay Carman
*Attorney, Agent, or Firm*—Ron Fish; Falk & Fish

[57] ABSTRACT

A method and apparatus for carrying out synchronous code division multiple access (SCDMA) communication of multiple channels of digital data over a shared transmission media. The system includes modems at remote units and a central unit to receive time division multiplexed digital data arranged into timeslots or channels and uses orthogonal codes to encode each channel of multiple data and spread the energy of each channel data over a frame of data transmitted in the code domain. Spreading the data this way makes the system less susceptible to impulse noise. Frames are synchronized as between remote and central units using a ranging scheme which is also useful in any other system transmitting data by frames in a distributed system where synchronizing the frames as between all units regardless of differences in propagation delays is necessary. Each frame in the SCDMA modulation scheme includes a gap or guardband containing no other data. The ranging process involves training each remote unit to impose enough delay prior to re-transmission of a barker code received from the CU such that a barker code sent by the RU arrives at the CU during the gap. The process of setting the delay in each RU is a trial and error process, and each RU starts the ranging process asynchronously. Contention resolution protocols such that only one RU is aligning to the gap at any particular time are taught.

33 Claims, 20 Drawing Sheets

U.S. PATENT DOCUMENTS

| | | | |
|---|---|---|---|
| 4,912,721 | 3/1990 | Pidgeon, Jr. et al. | 375/200 |
| 4,926,130 | 5/1990 | Weaver | 327/105 |
| 4,933,930 | 6/1990 | Lien et al. | 370/441 |
| 5,090,024 | 2/1992 | Vander Mey et al. | 375/204 |
| 5,193,094 | 3/1993 | Viterbi | 371/43 |
| 5,224,122 | 6/1993 | Bruckert | 375/200 |
| 5,231,664 | 7/1993 | Bestler et al. | 380/20 |
| 5,233,630 | 8/1993 | Wolf | 375/308 |
| 5,235,615 | 8/1993 | Omura | 370/342 |
| 5,235,619 | 8/1993 | Beyers, II et al. | 375/260 |
| 5,239,557 | 8/1993 | Dent | 370/342 |
| 5,280,472 | 1/1994 | Gilhousen et al. | 370/335 |
| 5,295,152 | 3/1994 | Gudmundson et al. | 370/342 |
| 5,297,162 | 3/1994 | Lee et al. | 375/206 |
| 5,305,308 | 4/1994 | English et al. | 370/335 |
| 5,309,474 | 5/1994 | Gilhousen et al. | 370/209 |
| 5,313,454 | 5/1994 | Bustini et al. | 370/231 |
| 5,319,634 | 6/1994 | Bartholomew et al. | 370/441 |
| 5,325,394 | 6/1994 | Bruckert | 375/200 |
| 5,327,455 | 7/1994 | De Gaudenzo et al. | 370/207 |
| 5,345,439 | 9/1994 | Marston | 370/320 |
| 5,345,472 | 9/1994 | Lee | 370/342 |
| 5,347,304 | 9/1994 | Moura et al. | 348/12 |
| 5,353,300 | 10/1994 | Lee et al. | 370/342 |
| 5,359,624 | 10/1994 | Lee et al. | 370/342 |
| 5,363,403 | 11/1994 | Schilling et al. | 370/441 |
| 5,363,404 | 11/1994 | Kotzin et al. | 370/335 |
| 5,373,502 | 12/1994 | Turban | 370/441 |
| 5,390,166 | 2/1995 | Rohani et al. | 370/335 |
| 5,394,391 | 2/1995 | Chen et al. | 370/441 |
| 5,398,258 | 3/1995 | Su et al. | 375/200 |
| 5,404,570 | 4/1995 | Charas et al. | 455/22 |
| 5,414,699 | 5/1995 | Lee | 370/342 |
| 5,416,797 | 5/1995 | Gilhousen et al. | 370/209 |
| 5,418,813 | 5/1995 | Schaffner et al. | 370/342 |
| 5,425,027 | 6/1995 | Baran | 370/395 |
| 5,440,585 | 8/1995 | Partridge, III | 375/261 |
| 5,442,625 | 8/1995 | Gitlin et al. | 370/342 |
| 5,442,627 | 8/1995 | Viterbi et al. | 370/209 |
| 5,442,662 | 8/1995 | Fukasawa et al. | 370/342 |
| 5,442,700 | 8/1995 | Snell et al. | 380/15 |
| 5,448,555 | 9/1995 | Bremer et al. | 370/206 |
| 5,452,328 | 9/1995 | Rice | 375/210 |
| 5,463,660 | 10/1995 | Fukasawa et al. | 370/342 |
| 5,467,342 | 11/1995 | Longston et al. | 370/253 |
| 5,481,533 | 1/1996 | Honig et al. | 370/335 |
| 5,511,067 | 4/1996 | Miller | 375/335 |
| 5,533,013 | 7/1996 | Leppanen | 370/342 |
| 5,539,730 | 7/1996 | Dent | 370/280 |
| 5,557,316 | 9/1996 | Hoarty et al. | 348/7 |
| 5,583,853 | 12/1996 | Giallorenzi et al. | 370/441 |

$$\int_0^T c_i \cdot c_j \, dt = \begin{cases} 1 & i = j \\ 0 & i \neq j \end{cases}$$

$$[b] \times [c] \times [c^T] = [b] \times [\lambda]$$

CODE 1 = $[1, 1]$

CODE 2 = $[1, -1]$

FIG. 3B

CODE #1 CODE #2

$$C = \begin{bmatrix} \begin{bmatrix} \frac{1}{\sqrt{2}} \\ \frac{1}{\sqrt{2}} \end{bmatrix} & \begin{bmatrix} \frac{1}{\sqrt{2}} \\ \frac{-1}{\sqrt{2}} \end{bmatrix} \end{bmatrix}$$

FIG. 3C

USER 1 FIRST FRAME DATA = 1

USER 2 FIRST FRAME DATA = -1

FIG. 3D

INFORMATION VECTOR FOR FIRST FRAME = b = $[1, -1]$

FIG. 3E

COMBINED SIGNAL TO TRANSMIT DURING FIRST FRAME $$R = b \bullet c = \overbrace{\begin{bmatrix} 1, & -1 \end{bmatrix}}^{b} \times \overbrace{\begin{bmatrix} \frac{1}{\sqrt{2}} & \frac{1}{\sqrt{2}} \\ \frac{1}{\sqrt{2}} & \frac{-1}{\sqrt{2}} \end{bmatrix}}^{c}$$

$$= \left[ \left( \frac{1}{\sqrt{2}} + \frac{-1}{\sqrt{2}} \right), \left( \frac{1}{\sqrt{2}} + \frac{1}{\sqrt{2}} \right) \right] = R$$

$$= \left[ 0, \frac{2}{\sqrt{2}} \right] = R$$

TRANSMIT SIDE MATRIX MULTIPLICATION

FIG. 3F $$R \bullet C^T = \overbrace{\left[ 0, \frac{2}{\sqrt{2}} \right]}^{R} \bullet \overbrace{\begin{bmatrix} \frac{1}{\sqrt{2}} & \frac{1}{\sqrt{2}} \\ \frac{1}{\sqrt{2}} & \frac{-1}{\sqrt{2}} \end{bmatrix}}^{C^T} = \left[ \left( 0 + \frac{2}{2} \right), \left( 0 + \frac{-2}{2} \right) \right]$$

$$= \begin{bmatrix} 1, & -1 \end{bmatrix}$$

RECOVERED $[b]$ AT RECEIVER $= [1, -1]$

FIG. 3G

GENERAL RANGING PROCESS

DEAD RECKONING RE-SYNC

PRECURSOR EMBODIMENT

| CODE | INPHASE | QUADRATURE |
|---|---|---|
| 0000 | 111 | 111 |
| 0001 | 001 | 111 |
| 0010 | 001 | 001 |
| 0011 | 111 | 001 |
| 0100 | 011 | 111 |
| 0101 | 001 | 011 |
| 0110 | 101 | 001 |
| 0111 | 111 | 101 |
| 1000 | 011 | 011 |
| 1001 | 101 | 011 |
| 1010 | 101 | 101 |
| 1011 | 011 | 101 |
| 1100 (403) | 111 | 011 |
| 1101 | 101 | 111 |
| 1110 | 001 | 101 |
| 1111 | 011 | 001 |

PROCESS FOR COMMUNICATING MULTIPLE CHANNELS OF DIGITAL DATA IN DISTRIBUTED SYSTEMS USING SYNCHRONOUS CODE DIVISION MULTIPLE ACCESS

FIELD OF THE INVENTION

The invention pertains to the field of bidirectional communication of digital data over coaxial cable or other transmission media. More particularly, the invention pertains to the field of provision of multiple channels of digital data including interactive TV services, digital telephony, video teleconferencing, video on demand, internet access at 10 megabit/second or media data rates etc., all provided to home or business establishments over cable TV coax or combinations of coaxial cable, fiber optic links, microwave or satellite links or other wireless systems using synchronous CDMA modulation.

BACKGROUND OF THE INVENTION

In order to provide bidirectional digital data communication over a cable TV coaxial network to multiple subscribers with multiple services available over a single coax cable (hereafter called interactive systems), several problems have to be solved. First, there is the problem of noise and interference. A second major problem, but related to the first problem, is synchronization of data transmission so that effective, error-free communication can be achieved. Cable networks typically involve a so-called head end or central unit from which video is transmitted to subscribers coupled to one or more main trunk lines from which extend numerous branch lines which may enter subscriber homes or which may couple to other branch lines. At each junction of a branch line to the trunk line or another branch line there is a directional coupler which is intended to direct transmissions from the head end to the subscribers in one direction and to direct transmissions from the subscribers back to the head end without leaking energy intended for transmission to the head end into branch lines coupled to other subscribers. In order to send digital data over video coax, a modem is necessary at both the head end and at all the subscriber locations to modulate digital data onto the coax as RF signals, and to receive RF signals carrying digital data and derive the digital data therefrom. Because RF signals are propagating along the cables, and because the couplers are not perfect, reflections occur at the directional couplers that cause noise and interference. This is because the reflections are frequently of the opposite polarity depending upon the impedance mismatch and the distances involved. These reflections are therefore sometimes additive and sometimes subtractive, thereby resulting in random variations in the amplitudes of the RF signals. These random variations make discrimination during the demodulation process to derive the digital data more difficult.

Further, because the subscribers are at physically different distances from the head end, the signals from each subscriber's modem arrive at the head end at different times because of different propagation delays. Because digital data is transmitted in frames and because all subscribers must be synchronized to the same frame timing, these different propagation delays for each subscriber cause problems in synchronizing data.

In the typical interactive system, there are bidirectional amplifiers. Each amplifier has two channels, one of which amplifies signals in a high frequency range from 45–750 mHz for transmission of data from the head end to subscribers, and the other of which amplifies signals in a low frequency range from 5–42 mHz for transmission of data from the subscribers to the head end. When the operating frequency is close to the edges of either the high or low band, group delay distortion can result in another impairment to noise free bidirectional communication.

Other forms of linear impairment result from the fact that the bandpass filters in the system do not have perfectly flat amplitude characteristics for their transfer functions across the entire passband, especially at the corner frequencies.

Other forms of impairments are so-called additive impairments resulting from taps on the system which are not properly terminated. These taps act as antennas and pick up broadcast signals from FM stations, CB radios, HF communication etc. Other sources of noise are impulse signals resulting from arcing in electrical appliances near taps. Arcing generates white noise type RF energy that is splattered across all bands and is radiated much like lightening. In addition, the amplifiers in the interactive system can sometimes break into oscillation thereby creating noise. Further the horizontal and vertical oscillators in television sets in the subscriber's household also can radiate RF interference signals. These sources of interference are a major contributor to noise in the system.

The collection of impairments described above are referred to as linear impairments because the system has a linear transfer function so that in the Fourier domain, all the impairment effects are additive.

In addition to the linear impairments, there also exist nonlinear impairments such as second and third order harmonics generated by the nonlinear junctions of transistors in the amplifiers in the system. When multiple sinusoidal signals arrive at the amplifiers, beat frequencies are generated in addition to the harmonics of the arriving signals because the nonlinear junctions act like mixers.

Other forms of nonlinear impairment are hum from saturation of magnetic cores of transformers in the amplifiers resulting from 60 volt, 60 Hertz AC square wave pulses sent to the amplifiers over the coax to supply the amplifiers with power. The amplifiers have rectifiers that rectify this square wave signal to derive power therefrom and this process generates noise in the form of hum. This hum is caused by amplitude modulation of the power supply signal resulting from the placement of the operating point on the hysteresis curve of the rectifier transformers.

Interactive systems typically involve in excess of one hundred different channels on which separate digital data streams can flow in addition to the separate channels on which the video signals are provided for normal cable TV service. To send digital data as RF signals, very complex constellations of separate amplitude and phase combinations are used to encode the digital characters being transmitted. Because of the large number of data points, the differences in phase and amplitude between the different points are not large. Therefore, the impairments described above can cause errors by causing misinterpretation by demodulators of what characters were actually sent.

There is only one conductive path between the head end and the subscribers that must be shared by all the subscribers to send and receive digital data. One approach that has been tried in prior art interactive cable TV systems is time division multiple access sharing (TDMA) with quadrature phase shift keying (QPSK) modulation schemes. In a TDMA system, each subscriber gets a short assigned time slot in which to transmit data to the head end. The TDMA approach has shortcomings in that it causes difficulty and complexity in achieving “alignment”. Alignment refers to the proper timing of each subscriber’s transmissions so that they arrive during the appropriate time slot at the head end despite the fact that the signals from each subscriber have different propagation times. Alignment in TDMA multiple access schemes is critical, and achieving it is difficult.

Another difficulty with the TDMA approach is the high susceptibility of QPSK modulation to narrowband interference. Narrowband interference results when a signal like Voice of America or a harmonic which has a bandwidth similar to the bandwidth of the channels upon which digital data is being transmitted enters the transmission media. Typically this happens at a tap which is not properly terminated. Narrowband interference adversely affects the receiver circuits and the alignment circuits that achieve synchronization of all the sources.

The use of TDMA schemes also complicates the alignment problem in the presence of narrowband interference and other noise because there is such a short time for synchronization. Synchronization of the head end to all the subscribers is necessary so that the clock signal and other reference signals such as the carrier can be recovered from the transmitted signals without being separately transmitted. These recovered signals are critical to proper operation of the system in demodulating the transmitted data. Narrowband interference also adversely affects the decision making circuits that decipher which characters have been transmitted thereby increasing the error rate. Increased error rate requires more bandwidth to be consumed in retransmitting data and wastes processing power in detecting and correcting errors and retransmitting data with errors that are beyond the correction range of the ECC bits transmitted with the data.

Also, because in TDMA schemes the timeslots are very short, TDMA systems are susceptible to loss of data caused by long bursts of noise. Typical bursts of impulse noise are quite long relative to the length of the TDMA timeslots. Long bursts often wipe out entire groups of timeslots thereby requiring retransmission of all the data in these timeslots. Modulation and multiple access schemes that spread out the energy of transmitted data over longer times, such as FDMA schemes, are less susceptible to this type of burst noise. However, FDMA schemes have other drawbacks.

QPSK modulation used in TDMA schemes is also not the most efficient modulation scheme in terms of spectral efficiency, i.e., speed of transmission in bits/second/Hertz over a given bandwidth. However, QPSK modulation is used because it has a sufficiently large distance between points in the constellation to maintain relatively good noise immunity. Noise immunity refers to the ability of a system to achieve a certain bit error rate that is deemed to be tolerable for a given signal to noise ratio. If the signal to noise ratio decreases for a given noise immunity characteristic, the bit error rate will rise.

Typically, channel bandwidths are 6 mHz, and spectral efficiency of 27 megabits/second/Hertz is desired. Therefore, a data transfer rate of $162\times10^{12}$ is achievable over one channel at this typical spectral efficiency and bandwidth. However spectral efficiency for QPSK modulation is on the order of 1 bits/second/Hertz or less so this modulation scheme is too slow for high traffic volume applications such as video on demand, video teleconferencing etc.

Another approach that has been tried in the prior art is frequency division multiple access (FDMA). In FDMA, each subscriber transmits data on a different carrier frequency as opposed to at a different time in TDMA. FDMA schemes suffer from different drawbacks than TDMA schemes. Because there are multiple carriers in FDMA schemes, there are more intermodulation products in the received signals. These intermodulation products can coherently add to each other thereby causing peaks in amplitude which are far greater than the average signal. This causes difficulty in designing analog circuits with adequate ranges of linearity to handle these signals without clipping the peaks. These peaks often penetrate into the nonlinear or saturation range of operation of analog circuits in the system exposed to these signals thereby introducing nonlinearities. Even without these nonlinearities, the intermodulation components tend to cause crosstalk between adjacent channels which increases the error rate.

FDMA schemes are also sensitive to narrowband interference signals that suddenly appear causing unanticipated “jamming” of one or more channels thereby causing long bursts of errors. FDMA channels are narrow, and claims have been made that because of this fact narrowband interference can be avoided. However, narrowband interference is dynamic, because there are multiple sources thereof at different frequencies. As a result, narrowband interference signals can suddenly “pop up” when a subscriber turns on his or her TV or when Voice of America starts broadcasting. This sudden pop-up interference can jam a channel thereby causing error bursts.

Therefore, a need has arisen for a method and apparatus that can support interactive digital systems that eliminates some of these drawbacks.

SUMMARY OF THE INVENTION

According to the teachings of the invention, there is provided a code division multiplexing multiple access (CDMA) scheme using orthogonal codes to encode the digital data being transmitted. Further, alignment of multiple subscribers at diverse locations to guardbands or gaps between frames is used to keep all subscribers in synchronization to the same frame timing. One inventive concept disclosed herein is to achieve high noise immunity by spreading the energy of the transmitted data out over time during transmission, and then compressing the energy again at the receiver to recover the data. Spreading the energy of the transmitted data out over time reduces susceptibility to burst errors and impulse noise. In addition to this spreading concept, the spectral efficiency of the system is enhanced by transmitting multiple separate channels of data over the same media without interference by using separate orthogonal codes to encode the data of each channel so that no interference results when all channels are simultaneously transmitted. In this way, the spectral efficiency, i.e., a measure of the amount of data that can be sent from one place to another over a given bandwidth, is enhanced without degradation of the data by crosstalk interference. The orthogonality of the codes used for each data stream minimizes crosstalk between data streams especially where the system is properly aligned, i.e., synchronized. In the preferred embodiment, the orthogonal codes are cyclic codes.

The effect of this synchronous CDMA scheme is to “whiten” the noise sources such that no matter how complex the noise signals, the noise can be effectively managed using conventional error detection and correction bits. In other words, the digital data providing the interactive or bidirectional data communication is sent using a CDMA scheme, but for purposes of synchronization, the CDMA scheme is mixed with a TDMA scheme. More precisely, a guardband free of data is added to the CDMA signal. Digital data is transmitted in frames, each frame comprising 3 data symbols and a guardband. The guardband is used for non-data usage such as ranging, alignment and equalization.

The synchronous CDMA modulation scheme disclosed herein may be used with any shared transmission media and with any apparatus or method that can get all RU's synchronized to the frame timing of the CU including the ranging/alignment scheme disclosed herein. Other possible methods of synchronizing are for all RUs and CU to receive the same timing reference signals from some source such as internal atomic clocks or an external source such as a satellite from which all RUs and CU are effectively equidistant.

Likewise, the ranging/alignment scheme disclosed herein is useful for any other modulation scheme which transmits digital data in frames, requires frame synchronization and can insert a guardband in each frame.

Any method or apparatus that uses these inventive concepts is within the teachings of the invention and is deemed to be equivalent to the apparatus and methods described herein.

BRIEF DESCRIPTION OF THE DRAWINGS

FIGS. 3B through 3G illustrate a specific working example of how the mathematical relationship of FIG. 3A could be used to transmit two channels of data simultaneously over the same shared media.

FIG. 13 also shows a number of other signals generated by time base generator 350 in FIG. 12.

DETAILED DESCRIPTION OF THE PREFERRED EMBODIMENT

Figures 1, 2, 3A:
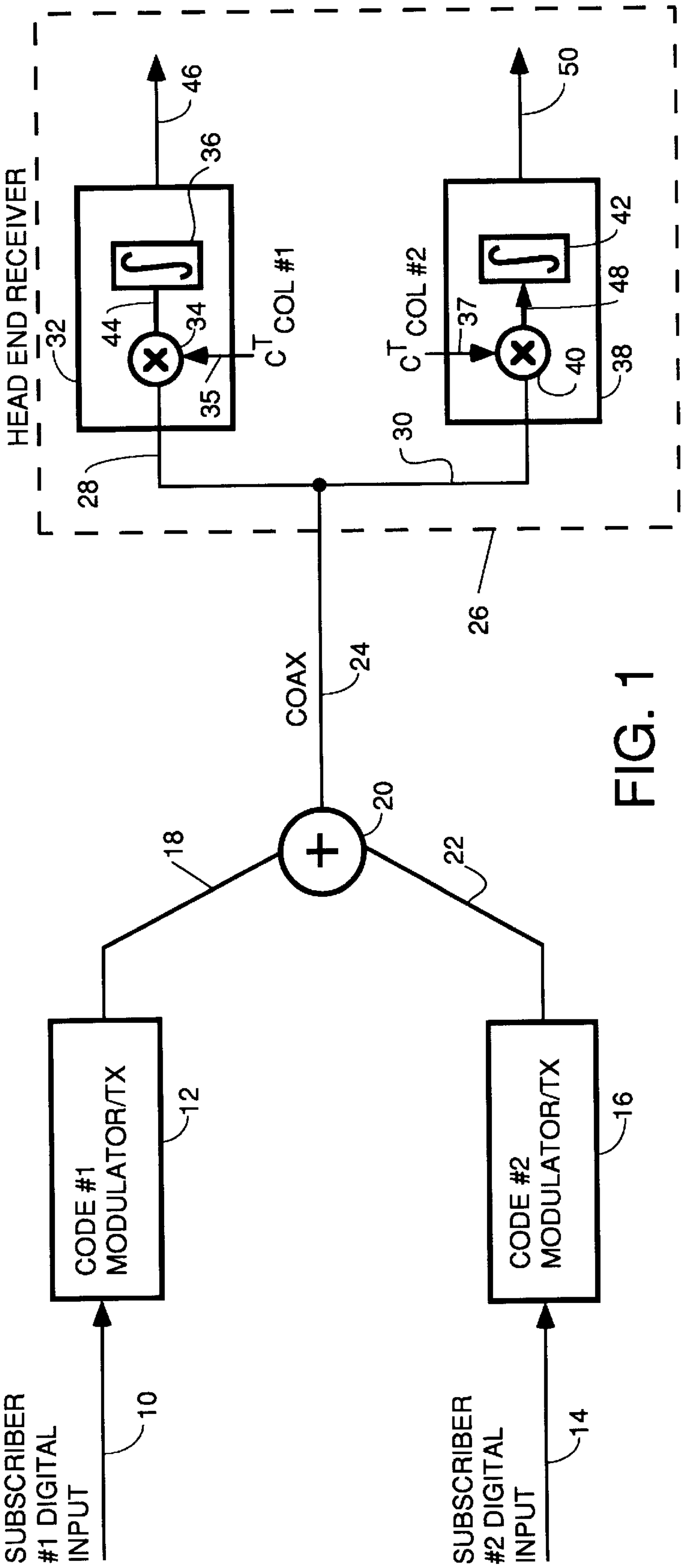
FIG. 1 is a block diagram of the functional elements needed for simultaneous transmission of digital data from multiple subscribers to a head end receiver over a shared coaxial cable using orthogonal codes and for recovery of the separate data streams from each subscriber at the head end receiver.
FIG. 2 is the mathematical relationship that defines the property of orthogonality of the codes used by the modulator/transmitters in FIG. 1.
FIG. 3A is the mathematical relationship that the system of FIG. 1 uses to recover the individual data streams sent by the subscribers at the head end and vice versa.

Referring to FIG. 1, there is shown a conceptual diagram of a system for multiple access digital communication over a cable TV coaxial conductor distribution system using orthogonal codes for CDMA. The system of FIG. 1 depicts only the circuitry to transmit data from multiple subscribers to a head end receiver. Similar circuitry to transmit data from the head end back to the subscribers exists but is not shown for simplicity.

FIG. 2 is the mathematical relationship that defines the property of orthogonality of the codes used by the modulator/transmitters in the system. The codes used in modulator/transmitters 12 and 16 are orthogonal if the summation of the product thereof over time from 0 to T is equal to 1 if the codes are the same code, i.e., if i=j where i=code #1 and j=code #2, but is zero if i is not equal to j. In other words, if the codes are different and orthogonal, the summation of the products of the signals modulated by these orthogonal codes is zero, meaning that signals modulated by the different orthogonal codes can travel over the same conductor without interference and without crosstalk. There is more that one set of orthogonal codes, but any orthogonal code will suffice to practice this aspect of the teachings of the invention.

FIG. 3A is the mathematical relationship which the system of FIG. 1 uses to send multiple channels of digital data over the same conductor without interference between channels. [b] in FIG. 3A represents an information vector that contains a symbol to be transmitted on each channel as a vector element. [c] represents a code matrix having the unique orthogonal code for each channel as its columns. [$c^T$] represents the transpose matrix of the code matrix [c] where each column of [c] becomes a row of [$c^T$]. Finally, [i] represents the identity matrix where all entries are zeroes except for a line of 1's along the diagonal. In FIG. 1 to be described below, the matrix multiplication [b]×[c] is the processing that occurs on the transmit side of each transmission. The processing that occurs on the receiver side of the transmission is a matrix multiplication of the transpose matrix [$c^T$] times the signals generated on the transmit side by the multiplication of the information vector [b] times the code matrix [c] to yield a matrix representing the product [b]×[i]. Because the identity matrix is known, the product [b]×[i] allows recovery of the information vector [b].

To utilize these mathematical relationships of FIGS. 2 and 3A and convert them into a practical digital data communication system, symbolized by the system of FIG. 1, subscriber #1 provides a digital input stream of symbols or bits using any input device or computer (not shown). This digital data stream to be transmitted to the head end arrives on bus 10 at the data input of a code #1 modulator/transmitter 12. This digital data stream will be divided into individual symbols transmitted at the rate of three symbols/frame in the preferred embodiment. The teachings of the invention can be employed using symbols, data bytes or any other grouping of digital data. The first bit from the stream on bus 10 will be the first vector element in the information vector [b]. For the sake of simplicity, the manner in which symbols are formed from the incoming data stream will not be described here, but will be described in greater depth below herein. In the preferred embodiment, symbols are formed by filling individual address locations in a framer memory (not shown) with 9 bit bytes which arrive one per timeslot. The individual data streams on buses 10 and 14 are TDMA streams divided into multiple successive timeslots. Thus, time increases along one axis of the framer memory. Symbols are formed by reading the memory "across time", i.e., along an axis orthogonal to the axis of increasing time.

In the embodiment shown in FIG. 1, modulator/transmitter 12 converts the digital data in the data stream arriving on bus 10 into amplitude modulations of a carrier signal using a first orthogonal code, and outputs the modulated carrier signal on feeder link coaxial conductor 18 coupled to an input of a summer 20. To do this, the modulator/transmitter 12 performs a matrix multiplication of the element of the information vector [b] from the TDMA stream on bus 10 times the appropriate element of the first column of code matrix [c], i.e., code #1 and uses the results to control a modulator which appropriately modulates an RF carrier. All other elements of the information vector [b] representing data from other TDMA streams at other locations are set to zero at the location of modulator/transmitter 12 but are set to the appropriate values at the modulator/transmitters at the locations of their respective TDMA streams. Thus, each modulator/transmitter does only the portion of the matrix multiplication [b]×[c] for data from its TDMA stream. The individual partial products from each modulator are summed by a summer 20 to give a result vector R=[b]×[c] representing the final result of the full matrix multiplication.

Likewise, subscriber #2 provides a digital data input stream on bus 14 to a code #2 modulator/transmitter 16. This digital data stream on bus 14 will be divided into individual symbols or bits to be transmitted. The first bit from the stream on bus 10 will become the second vector element in the information vector [b].

Modulator/transmitter 16 converts the digital data in the data stream arriving on bus 14 into amplitude modulations of a carrier signal by partial matrix multiplication similar to that done by modulator/transmitter 12 using a second code, i.e., another column of the code matrix [c] which is orthogonal to said first code. Modulator/transmitter 16 then outputs the modulated carrier onto a feeder link coaxial cable 22 coupled to another input of summer 20. That is, the modulator/transmitter 16 performs the multiplication of the second element of information vector [b] times the appropriate element of the second column of code matrix [c], i.e., code #2.

The effect of the multiplications by the modulator/transmitters 12 and 16 is to spread the energy of each bit or symbol to be transmitted out over time by multiplication of each bit in the information vector by the multiple code elements in the appropriate column of the code matrix [c].

Further, because the symbols are read from the framer memory "across time", the individual bits in the TDMA streams in the time domain on buses 10 and 14 are not transmitted in contiguous temporal relationship in the symbols used in the matrix multiplications to generate the signals transmitted in the code domain on coaxial/fiber data paths 18, 22 and 24. This form of spread spectrum modulation renders the system less susceptible to burst or impulse noise interference that adversely affects timeslots in the TDMA streams. The use of orthogonal codes provides simultaneous multiple access such that multiple digital channels can be simultaneously transmitted over a shared data path, and minimizes crosstalk between digital channels, especially where proper frame timing alignment among multiple subscribers is utilized. To implement this modulation scheme, each of the modulator/transmitters 12 and 16 uses the partial results of the multiplication [b]×[c], i.e., one element of the [b] vector times the appropriate element of a column of the [c] matrix, to modulate a carrier signal generated therein to generate the RF signals which are summed by summer 20 and transmitted to the head end receiver 26 on coaxial links 18 and 22.

As a specific example to illustrate how the information vector is multiplied by the code matrix in the transmittter/modulators, please refer to the following. In this hypothetical, assume that code #1 for user 1 is [1,1] and that code #2 for user 2 is [1,−1], as depicted on FIG. 3B. Thus, the first column of the code matrix will be $1/\sqrt{2}$, and $1/\sqrt{2}$ from top to bottom and the second column of the code matrix will be $1/\sqrt{2}$, and $-1/\sqrt{2}$ from top to bottom, all as shown in FIG. 3C. Note that each code element in this embodiment is divided by $\sqrt{2}$ for reasons which will be described below.

Also, assume that user 1 asked for and received one channel designated channel #1 from a head end allocation circuit (not shown) and wants to transmit a +1 during a first frame of data on transmission media 24. Also, assume that user 2 asked for and received one channel to transmit data and that channel is designated channel #2, and assume that user 2 wants to transmit a −1 during the first frame. In such a case, the information vector [b] for the first frame of data to be transmitted is [1,−1] with the first element, 1, representing the number the first user wants to send during the first frame on channel 1, and the second element, −1, representing the number the second user wants to send during the first frame on channel #2. These concepts are all represented by FIGS. 3D and 3E.

The multiplication of the information vector [b] times the code matrix [c] results in a result vector R for transmission of [0,2/√2]. This multiplication is done by multiplying information vector [1,−1] times the first column of the matrix and summing the two products 1/√2 and −1/√2 yield 0 as the first element of the result vector. Next, the information vector [1,−1] is multiplied by the second column of the code matrix to yield two partial product results of 1/√2 and 1/√2. These two partial product results are summed by the summer 20 to yield the second element in the result matrix, 2/√2, all as shown in FIG. 3F. Therefore, the modulator/transmitter 12 will modulate the carrier to an amplitude or frequency representing the level 0 of the first element of the result vector R=[0,2/√2] during a first time and drive the carrier so modulated onto coaxial link 18 during the first time. Likewise, the modulator/transmitter 16 will modulate the carrier to an amplitude or frequency representing the level 2/√2 of the second element of the result vector R during a second time and drives the carrier so modulated onto coaxial link 22 as the combined signal carrying the data from both channels #1 and #2 simultaneously across the shared transmission media 24.

Shared transmission media 24 can be any metallic or fiber optic media, terrestial microwave link or satellite/cellular link. Appropriate interface circuitry to place the result signal represented by the vector [0,2/√2] onto the particular transmission media are known and are not critical to the invention.

The multiplication [b]×[c] is carried out by the two code modulator/transmitters 12 and 16, each doing a part of the multiplication. Modulator 12 multiplies the first element of the information vector [b] from subscriber #1 times the elements in the first column of the code matrix and outputs the resulting partial products during two successive intervals on line 18 coupled to the input of the summer 20. Likewise, the code #2 modulator 16 multiplies the second element of the information vector [b] from subscriber #2 times the two elements in the second column of the code matrix [c] and outputs the resulting two partial products on line 22 to the summer 20 during the same two successive intervals used by modulator 12 . The signals output by the modulator/transmitters 12 and 16 during the first of the two successive intervals are summed by summer 20 and output on coaxial cable 24 as the first component, 0, of the result vector R=[0,2√2]. The signals output by the modulator/transmitters 12 and 16 during the second of the two successive intervals are summed by summer 20 and output on coaxial cable 24 as the second component, 2/√2, of the result vector [0,2/√2].

Not shown in FIG. 1 for simplicity is a modulator that takes the result vector and uses it to modulate the amplitude, phase or frequency (or some combination of these) of a radio frequency carrier, which is then input to the shared transmission media 24 for transmission to the head end.

To recover the original information vector [b], on the receiver side of the transaction, the receivers multiply the received signals times the transpose code matrix [$C^T$] in a manner to reverse the encoding process. To derive the transpose matrix, the columns of the code matrix [c] become the rows of the transpose matrix [$c^T$]. In the hypothetical example at hand, the transpose matrix will have [1/√21/√2] as its first row corresponding to the first column of the code matrix [c]. The second row of the transpose matrix will be [1/√2, −1/√2] corresponding to the second column of the code matrix [c], as shown in FIG. 3G. Thus, in the example at hand, the transpose matrix [$c^T$] is actually identical to the code matrix [c]. The result of multiplication of the result vector R=[0,2/√2], representing the signal on coaxial cable 24, times the first column of the transpose matrix is 0+2/2=1 for the first element of the recovered information vector [b]. The result of multiplication of the result vector [0,2/√2] times the second column of the transpose matrix is 0+(−2/2)=−1 for the second element of the recovered information vector [b]. The resulting recovered information vector [b] is [1,−1].

In the preferred embodiment, a normalization factor, equal to the square root of the number of separate codes in use, is used on both the transmit and receive sides as a denominator for each code matrix element and as a denominator for each transpose matrix element. This enables recovery by the receivers of an information vector [b] which has elements which are equal to the original data generated by the users. In the example of FIGS. 3B through 3G, each of the elements in the code matrix [c] (and, consequently, its transpose matrix [$c^T$] )are divided by this normalization factor √2.

Returning to the discussion of FIG. 1, coaxial cable 24 is coupled to a head end receiver 26. At the head end receiver, the signal on cable 24 is split onto separate coaxial cable links 28 and 30, each of which is coupled to a receiver of which receivers 32 and 38 are typical. The function of the receivers is to demodulate the received signals to derive the elements of the result vector which were used as modulation factors, and to multiply these result vector elements times the columns of the transpose matrix [$c^T$] to recover the information vector [b] originally transmitted. To accomplish this function, link 28 is coupled to the analog input of a receiver 32 which is comprised of a multiplier 34 and an integrator 36.

Not shown, for the sake of simplicity, is a demodulator/discriminator which converts the amplitude, phase or frequency variations (or some combination of the two) of the incoming RF signals received from coaxial cable/fiber optic data path 24 into analog signals representing the result vector elements which are coupled to the analog inputs of the multipliers 34 and 40.

The multiplier 34 receives as one input the demodulated analog signal on link 28 and as another input on line 35 an analog signal representing the elements in column 1 of the transpose matrix [$c^T$].

Likewise, link 30 and the demodulator/discriminator (not shown) is coupled to a receiver 38 which is comprised of a multiplier 40 and an integrator 42. The multiplier 40 has as one input, the analog demodulated signal from link 30 and has as another input a signal on line 37 representing the elements of column 2 of the transpose matrix [$c^T$].

Multiplier 34 multiplies the signals on link 28 during a first time interval times the first column element of the first column of the transpose matrix and outputs the result on line 44 to the summation input of integrator 36. During the second time interval when the second element of the result vector [0,2/√2] is arriving, the multiplier 34 multiplies the second element thereof, 2/√2, times the second element in the first column of the transpose matrix $[c^T]$ and outputs the partial product result on line 44 to the summation input of the integrator 36. The integrator 36 sums the two partial products from the first and second time intervals, and outputs the sum on line 46 as the first element, 1, of the recovered information vector [b].

Likewise, multiplier 40 multiplies the signals on line 30 during a first time interval when the first element, 0, of the result vector $[0,2/\sqrt{2}]$ is arriving times the first element of the second column of the transpose matrix $[c^T]$ arriving on line 37. The resulting partial product is output on line 48 to the input of the integrator 42. During the second time interval, when the second element $2/\sqrt{2}$ of the result vector $[0,2/\sqrt{2}]$ is arriving on coaxial link 30, multiplier 40 multiplies this second element times the second element of second column of the transpose matrix. The resulting partial product during the second time interval is output on line 48 to the integrator 42. The integrator sums the two partial product results on line 48 over time, and outputs the result on line 50 as the second element, −1, of the recovered information vector [b]. The information vector [b] can then be disassembled into its components such that the TDMA data streams from which data was taken to compose the information vector can be re-created at the receiver end of the transaction.

Those skilled in the art will appreciate that the first and second conductors could also be assigned to carrying two different data streams sent on different channels both of which were originated by the same subscriber.

Throughout this example, the conductors of the distribution system have been referred to as coaxial cable. Those skilled in the art will appreciate that with suitable adjustments of the frequencies of operation and addition of appropriate transmit and receive circuitry, one or more of the various coaxial cable links described herein could be fiber optic cable, microwave links, radio frequency links, etc. since the medium of transmission is not critical to the invention.

In the preferred embodiment, the orthogonal codes used in the modulator/transmitters are cyclic codes. In cyclic orthogonal codes, all codes used are the same sequence of numbers, but each code is shifted by one or more bit positions from the preceding code. Although any set of orthogonal codes will work to implement the invention, the cyclic orthogonal codes simplify implementation issues by reducing the amount of storage needed to store the codes.

Those skilled in the art will appreciate that each subscriber transmitter may transmit multiple channels of digital data, and that the matrix multiplication and summation operations described above may be performed with digital circuitry such as suitably programmed microprocessors.

In an alternative embodiment, the separate streams of digital data are transmitted using spread spectrum frequency hopping techniques. In this embodiment, a first stream of digital data will be transmitted from one end to the other using a carrier that hops in frequency in accordance with a first predetermined coded sequence. Likewise, the second stream of digital data is transmitted on a carrier that hops in frequency in accordance with a second predetermined sequence. In this embodiment, the transmitter/modulators receive code sequence inputs that control the frequency of an oscillator that generates a carrier frequency. The codes that control the frequency of the transmitters for the various channels are orthogonal. The receiver for channel 1 receives the same code sequence that was fed to the transmitter for channel 1. This code sequence controls the frequency of a local beat frequency oscillator for receiver 1 and is synchronized with the code sequence fed to the transmitter for channel 1. Likewise, the receiver for channel 2 receives a code sequence that is orthogonal to the receiver for channel 1 code sequence and controls the beat frequency oscillator of the receiver for channel 2 to synchronously generate hops in the local oscillator frequency that track the hops in the frequency of the carrier for the transmitter for channel 2.

GENERAL DISCUSSION OF THE ALIGNMENT/RANGING PROCESS

Alignment is an important issue for optimal operation of the system of the genus represented by FIG. 1 with minimal cross talk between channels. In the system of FIG. 1, the time slots in the TDMA streams on lines 10 and 14 are the channels. The digital data in each time slot in the TDMA streams on lines 10 and 14 is data transmitted on that channel. The digital data in the TDMA streams is re-arranged into symbols, as described briefly above, and is transmitted in frames, with three symbols plus one guard band or gap per frame. The guardband or gap is reserved for transmission of alignment barker codes, and no other data is supposed to be transmitted during the gaps.

The concept in alignment is to adjust variable delays imposed at the site of each transmitter prior to transmission of a barker code so as to compensate for different propagation delays from each transmitter site such that the barker code from each subscriber transmitter trying to align arrives at the head end receiver during the same gap. When the variable delays at each subscriber transmitter are adjusted properly, each subscriber will be said to be in alignment so that the signals encoding the symbols that are simultaneously transmitted on the shared data path 24 will all be transmitted with the same frame timing.

Alignment is important to obtain pure orthogonality so as to obtain zero cross talk. If the transmitters are not perfectly aligned, the signals transmitted can still be recovered, but there is some cross talk between channels which will limit the capacity of the system to carry information.

This process of aligning all the delay circuits in the transmitters is sometimes alternatively called ranging herein and is broadly applicable to other types of multiple access digital data transmission systems also which suffer from different propagation times from different transmitter sites such as time division multiple access systems that form part of the prior art discussed above.

Figure 4A:
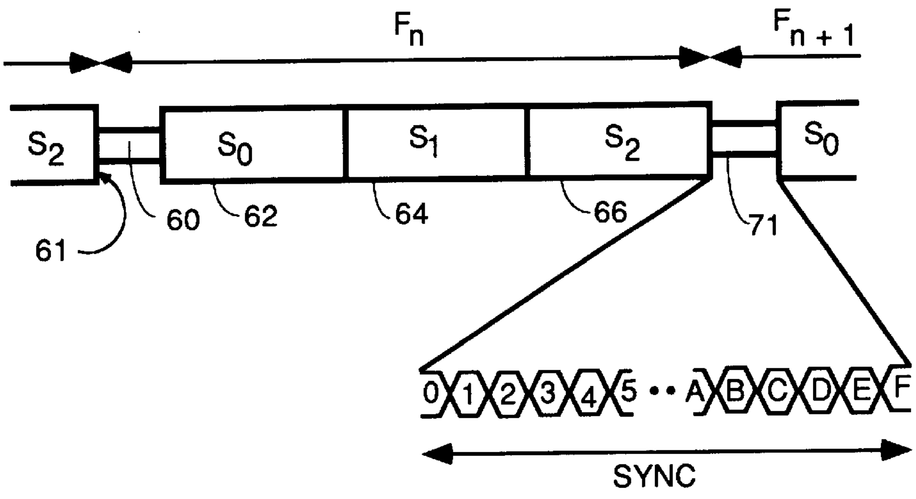
FIG. 4A shows a typical data structure for a frame.

Referring to FIG. 4A, there is shown a diagram of the typical frame structure. Each frame is composed of three symbols of 144 chips each and a gap or guardband comprised of 16 chips for a total of 448 chips each having 278 nanoseconds duration. The chip is the basic unit of time in the "code domain", where code domain refers to the signals propagating across the shared media. In FIG. 4A, the three symbols of frame $F_n$ are symbolized by blocks 62, 64, and 66. The gap or guardband is symbolized by blocks 60 and 71. There is one guardband associated with each frame. The guardband 71 (sometimes also referred to herein as the gap) is used for synchronization and equalization purposes for the frame comprised of symbols 62, 64, 66 and guardband 71. The symbols carry the information for the various channels of digital data provided to the subscribers. The frame period is 125 microseconds. The frame data payload is 128 channels times 72 kilobits per second per channel plus 16 control and management channels each of which has a data rate of 72 kilobits per second for management and control information.

Hereafter, each subscriber transmitter will be referred to as a remote unit or RU, and the central unit or head end will be referred to as the CU.

The process of synchronization is the process wherein each RU is "trained", i.e., has a variable delay in its transmitter set using feedback from the CU on one of the management and control channels such that the transmitted frame from each RU arrives at the CU at the same time. Alignment of all frames from all RUs results in the beginning of the gap 60 for each frame from each RU occurring at the same time at the location of the CU regardless of differences in propagation delays from the various RUs to the CU. In FIG. 4A, time increases to the right. Therefore the beginning of the guardband 60 is located at point 61.

Figure 4B:
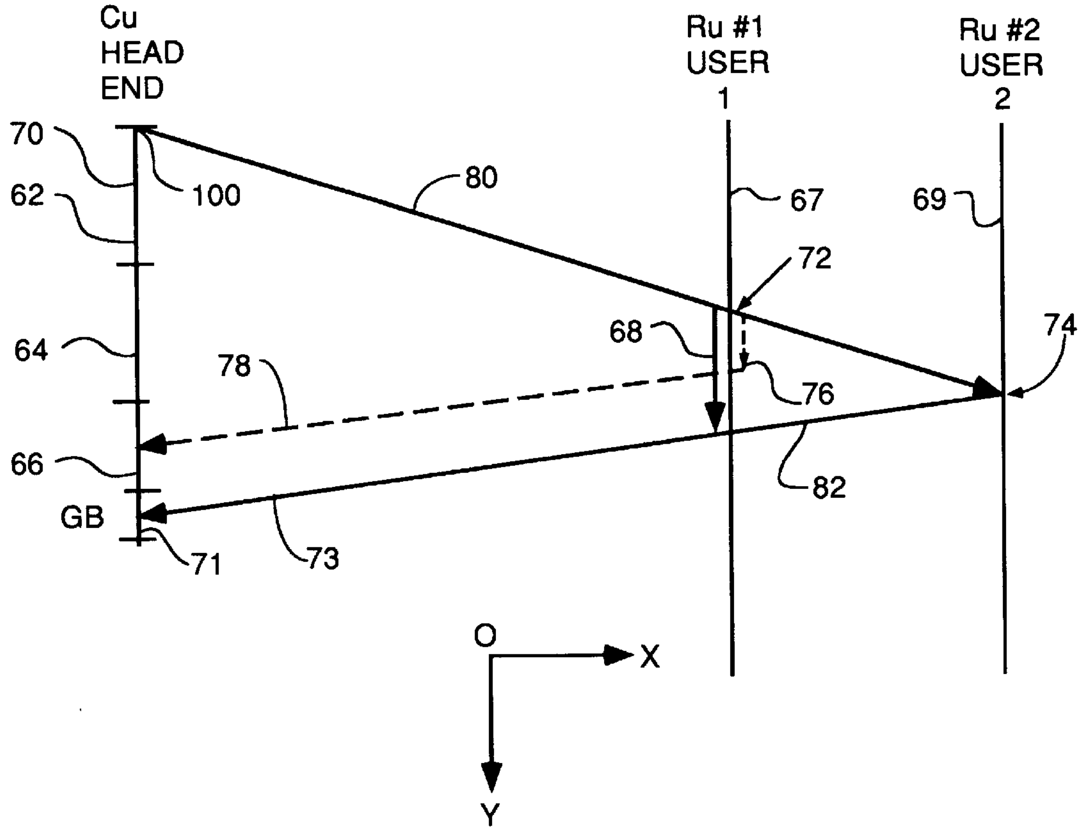
FIG. 4B is a symbolic diagram illustrating the concepts involved in alignment.

Referring to FIG. 4B, there is shown a symbolic diagram illustrating the concepts involved in alignment. In FIG. 4B points having increasing positive coordinates along the y-axis starting from the origin at 100 represent increasing time. Points along the x-axis to the right of origin represent increasing distance from the central unit which is designated at position 70. Time 100 represents the beginning of symbol 62 in FIG. 4A at the CU. The gap 71 at the end of the three symbols will be used for alignment, and the end of gap 71 will be deemed the end of the frame.

The alignment process is started asynchronously by any RU that needs to align. The central unit transmits a barker code during each frame at the same time in the frame. This barker code is received by each remote unit at a different time because of different propagation delays, but as to any particular RU, the barker code is always received at the same time during every frame until the CU changes its delay (a concept to be discussed more fully below). The barker code represents a trigger to any RU attempting to align and marks the receive frame timing reference for that RU. The time of receipt of the barker code represents the start of the variable delay interval being adjusted by the RU during the alignment process.

The barker code transmission during the frame shown in FIG. 4B is represented by line 80. The barker code is received by RU #1 at position 67 at time 72. The barker code is received by RU #2 at position 69 at time 74. The alignment process is a trial and error process of adjusting a delay from the time of receipt of the barker code to the time of transmission of the same barker code by each RU back toward the central unit 70 until the delay is properly adjusted such that the re-transmitted barker code arrives at the CU during the gap. Vector 68 represents correct delay timing for RU #1 at position 67 such that its barker code transmission 73 arrives in the middle of the gap 71. Dashed vector 76 represents an incorrect delay resulting in a barker code transmission, represented by dashed line 78, from RU #1 which arrives sometime during the middle of symbol 66 thereby missing the gap 71. This condition represents an incorrect alignment and may result in crosstalk.

Likewise, the RU #2 at position 69 uses zero delay and emits a barker code transmission 82 immediately upon receipt of the barker code trigger transmission 80 from the CU 70. This barker code transmission 82 from RU # 2 also arrives during the middle of gap 71 thereby indicating that RU # 1 and RU # 2 are correctly aligned.

The alignment barker code transmissions are typically short bursts having energy levels which are sufficient to make detection during gap 71 easy even though gap 71 also includes random noise energy.

The alignment barker code transmissions are detected during the gap by performing a correlation mathematical operation in the CU receiver between the barker code that was transmitted and the received signal. If the received signal was the same barker code that was transmitted by the CU, the correlation operation will output a signal that peaks at the time of maximum overlap between the barker code transmitted by the CU and the received signal. The timing of this peak indicates the alignment state of the RU that transmitted the barker code which resulted in the peak. Because the barker code transmissions are relatively short in duration and their amplitudes are not excessive, arrival of a barker code transmission during the middle of a symbol will generally not cause errors in the interpretation of symbol 66 by the CU receiver. Each symbol encoded in the code domain includes error detection and correction bits (ECC bits) such that any errors that occur can usually be detected and corrected when the symbols are re-constituted by the framer circuitry in the receiver. Therefore, if the barker code alignment transmission does result in an error, that error will usually be within the detection and correction range of the ECC bits of each symbol.

Figure 5:
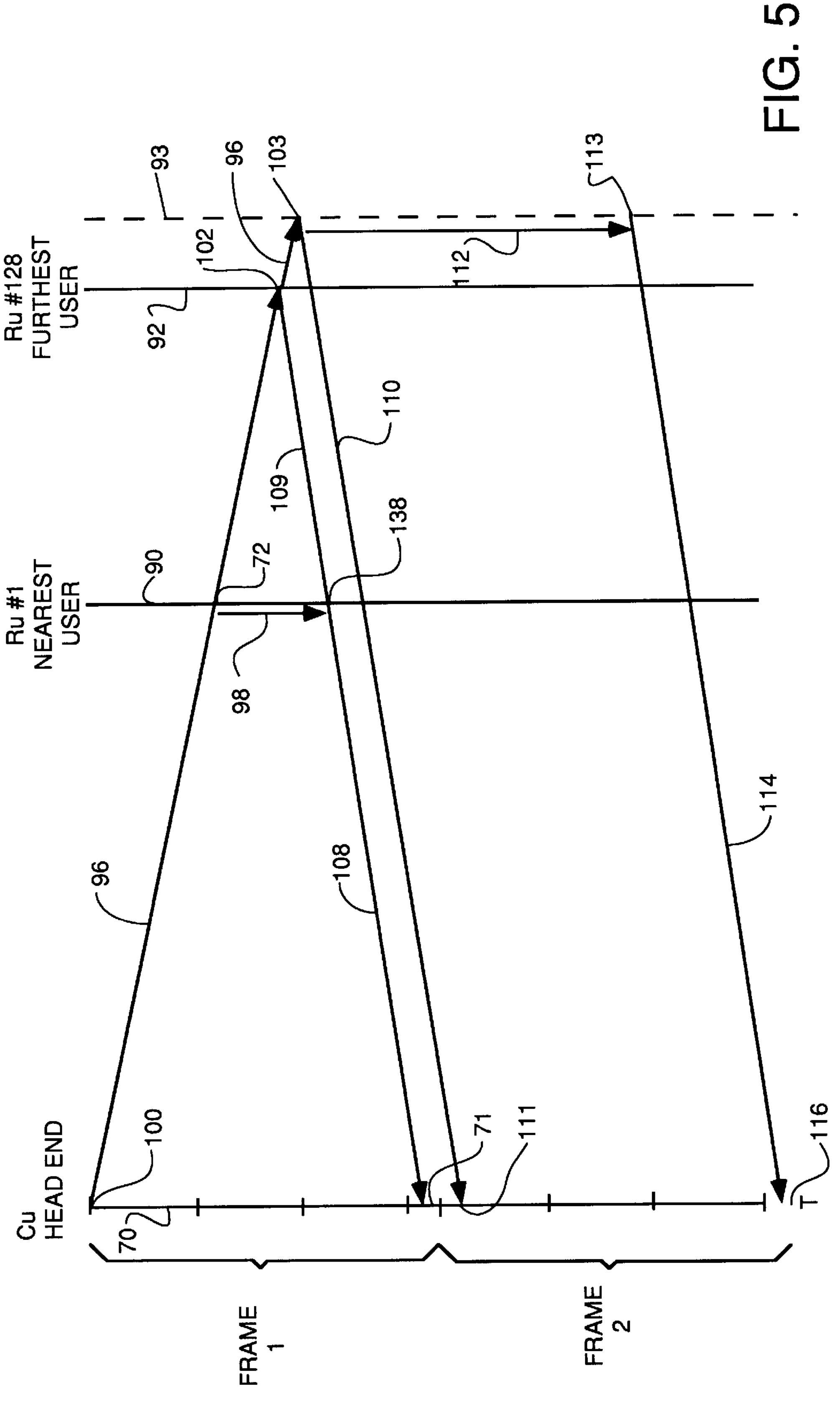
FIG. 5 is a diagram like that of FIG. 4B which illustrates a problem which occurs when the network physically expands.

Referring to FIG. 5, there is shown a diagram like that of FIG. 4B which illustrates a problem which occurs when the network physically expands. This can occur under certain circumstances such as during the heat of a summer afternoon when the physical media thermally expands thereby altering the propagation times of barker code signals from the CU to the RUs and from the RUs back to the CU. In the example shown, the CU 70 transmits barker code 96 at time 100. This barker code reaches the nearest RU, RU #1, at position 90 at time 72. The same barker code reaches the furthest RU, RU #128, located at position 92 at time 102. RU #1 uses a delay symbolized by vector 98 and re-transmits the barker code 108 at time 138. This alignment transmission hits gap 71 in frame #1 indicating that RU #1 is properly aligned.

The RU #128, when located at position 92 uses no delay and immediately retransmits barker code transmission 109 at time 102. Transmission 109 also arrives during gap 71 indicating that, at least at position 92, RU #128 is properly aligned.

Now suppose that the network physically expands such that RU #128 finds itself physically at position 93. In this position, RU #128 receives barker code transmission 96 from the CU at time 103, and, because RU #128 is already using the minimum possible delay for retransmission of an alignment code, alignment transmission 110 is also transmitted at time 103. However, because of the physical expansion of the network, alignment transmission 110 reaches the CU at time 111 which is after the end of the gap 71 and sometime in the middle of the first symbol of frame #2.

When an RU properly hits the gap, it is authenticated, i.e., identified, and the CU tells it that alignment has been achieved thereby causing the RU to stop adjusting its delay by trial and error. Because RU #128 does not receive any acknowledgement from the CU that it is properly aligned, its starts incrementing its delay vector in a trial and error process. After several incrementations, the delay vector finally reaches the delay represented by vector 112. With this delay vector, an alignment transmission 114 is transmitted from RU #128 at time 113 which reaches gap 116 located at the end of frame 2. However, this means that RU #128 is synchronized with the wrong frame. It is required for proper operation of the system to have all RUs synchronized to the gap at the end of the same frame in which the barker code transmission from the CU which triggered the RUs alignment transmissions occurred. If one or more RU aligns to the gap at the end of another frame, the results can be disastrous in terms of errors generated in the CU receiver in interpreting data transmitted by the RUs.

Figure 6:
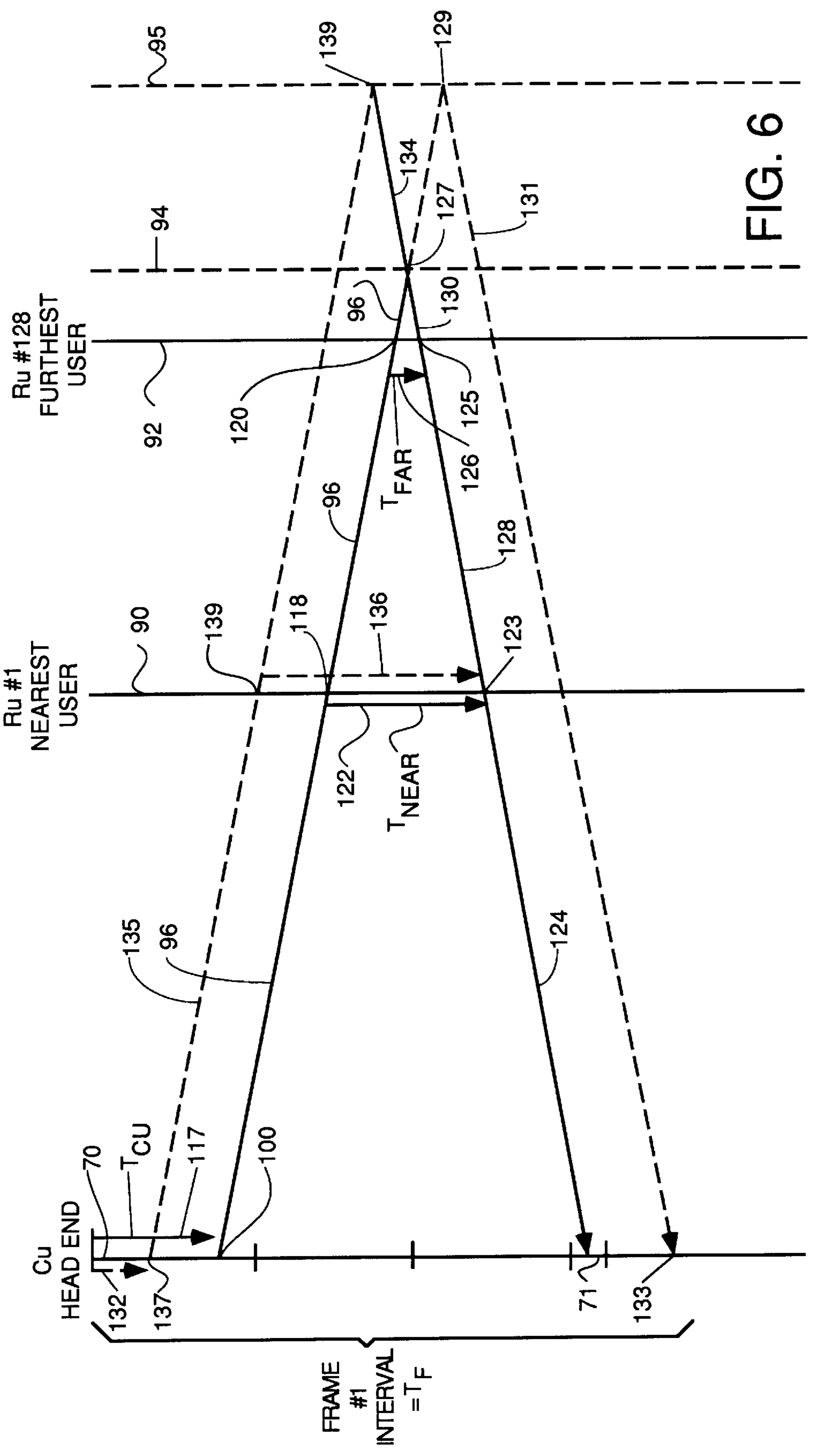
FIG. 6 is a diagram like that of FIG. 5 which illustrates the solution to the misalignment problem outlined in the discussion of FIG. 5.

Referring to FIG. 6, there is shown a diagram like that of FIG. 5 which illustrates the solution to this misalignment problem outlined in the discussion of FIG. 5. In the diagram of FIG. 6, CU 70 imposes a delay, represented by vector 117, prior to transmitting the alignment triggering transmission 96 at time 100. The barker code transmission 96 arrives at the nearest RU, RU #1, at position 90 at time 118. Time 118 establishes the receive frame timing for RU #1. RU #1 then imposes a delay represented by vector 122 and transmits the same barker code alignment transmission 124 at time 123. Time 123 establishes the transmit frame timing reference for RU #1. The time delay between times 118 and time 123 is predictable since the CU will transmit its barker code transmission 96 at the same time during every frame until such time as it is necessary to alter the timing of transmission 96 to keep all RUs in alignment. In other words, the time of reception of the barker code transmission 96 for all RUs is predictable and will be a periodic signal which happens once during each fame. The alignment transmission 124 from RU #1 reaches gap 71 at the end of frame #1.

The alignment transmission 96 from the CU reaches RU #128, the furthest RU, at time 120. Time 120 establishes the receive frame timing reference for RU #128 while at position 92. Thereafter, at time 125, the RU #128 transmits alignment transmission 128. This transmission arrives during the gap 71 at the end of the first frame thereby indicating that RU #128 is properly aligned at this position.

As in the case of RU #1, the delay between times 120 and 125 for RU #128 is predictable.

Now suppose that the network expands, and RU #128 finds itself at position 94. In this position, the CU alignment triggering transmission 96 arrives at time 127. In order to stay aligned, RU #128 will reduce its delay vector 126 to zero and immediately retransmit an alignment transmission 130 comprising the same barker code which it received. The transmission 130 arrives during gap 71 thereby indicating that RU #128 is still aligned at its new position by cutting its delay vector to zero.

Now assume that the network further expands such that RU # 128 finds itself at position 95. In this new position, alignment transmission 96 from the CU would arrive at time 129. With a zero delay by RU #128, the resulting alignment transmission 131 would arrive at time 133 just after the end of the gap 71 thereby indicating the RU #128 had been taken out of alignment by the expansion of the network. RU #128 would then continue to adjust its delay vector until it aligned to the next gap following the end of frame #2 thereby causing errors.

To prevent this from happening, when the CU finds that an RU which was previously in alignment has gone out of alignment because of network expansion, the CU will reduce its initial delay from the delay represented by vector 117 to the delay represented by vector 132. With this new delay vector, a barker code alignment triggering transmission 135 will be transmitted at time 137. This alignment triggering transmission 135 will arrive at the position of RU #1 at time 139 and will establish a new receive frame timing reference. If RU #1 has not adjusted its delay vector 122 in advance by one of the mechanisms to be described below, it will go out of alignment. It may then enter a realignment phase and will ultimately, by trial and error, adjust its delay vector to that represented by dashed vector 136. After so adjusting its delay, RU #1 will transmit an alignment transmission 124 at time 123 so as to again hit gap 71 thereby re-entering alignment.

The alignment triggering transmission 135 from the CU arrives at the position 95 of RU #128 at time 139. Using a zero delay vector, RU #128 transmits its alignment transmission 134. This alignment transmission 134 arrives during gap 71 thereby placing RU #128 again in alignment.

FIG. 6 shows an alignment process where the alignment is to the gap at the end of the first frame in which the alignment trigger signal 96 is transmitted. In real life systems, this may not be practical, so the alignment process is carried out to the gap following some integer number of frames in the future. The mathematical expression which defines this relationship is given in equation (1) below:

$$TTA=T_{cu}+T_{ru}+2\times T_p=\text{constant}=n\times T_F \quad (1)$$

where

TTA=the total turnaround time from the CU to the farthest RU;

$T_{cu}$=the delay imposed by the CU illustrated by vector 117 in FIG. 6;

$T_{ru}$=the delay imposed by the farthest RU illustrated by vector 126 in FIG. 6 (also called $T_{far}$);

$2\times T_p$=two times the propagation delay $T_p$ from the CU to the farthest RU; and $n\times T_F$=an integer multiple of the frame interval $T_F$.

Of course, when the network expands, there is a certain additional delay in the propagation delays which will be called $T_u$ for the uncertainty of this additional propagation delay. Therefore, three additional requirements are imposed with respect to how much delay the CU and the RUs must be able to impose. Those additional requirements are given below in equations (2), (3) and (4):

$$T_{cu}=[T_d+T_u]\text{modulo } T_F \quad (2)$$

where $T_d$=the span of the network, i.e., equal to the quantity $[TTA_2-TTA_1]$ where $TTA_2$ equals the total turnaround propagation time for a signal to propagate from the CU to the farthest RU and back, and $TTA_1$ equals the total turnaround propagation time for a signal to propagate from the CU to the nearest RU and back; and modulo $T_F$=the remainder of $[T_d+T_u]$ divided by $T_F$.

$$T_{far}>T_u \quad (3)$$

where $T_{far}$=the smallest possible $T_{ru}$ of the farthest RU and is equal to the smallest RU delay which can be imposed by the farthest RU;

$$T_{near}<T_F-T_u \quad (4)$$

where $T_{near}$=the maximum possible $T_{ru}$ of the nearest RU.

What all this means in a practical sense is that to set up the delays in the network so that all RUs are aligned, the following steps are taken and the limitations on possible delays imposed by the CU and RUs given in equations (1) through (3) are imposed so that all RUs align to the same gap. The practical network to be aligned by the following procedure has a CU coupled by a fiber optic trunk line to an optical node. The optical node is located out in the area to be served and can be coupled to as many as 2000 homes by 2000 individual coaxial links. To align such a network, step 1 would be to bring an RU to the position of the optical node and fix its delay at $T_{near}=T_F-T_u$. With this delay, the nearest RU would not hit any gap except by shear luck. Assuming the nearest RU does not hit the gap with this delay, the second step would be to adjust the delay of the CU until the nearest RU hits a gap. When this occurs, the condition $T_{cu}=[T_d+T_u]$ modulo $T_F$ would be true meaning that the CU would have adequately compensated for the uncertainty of the propagation delay increment to $T_d$ caused by network expansion.

Figure 7A:
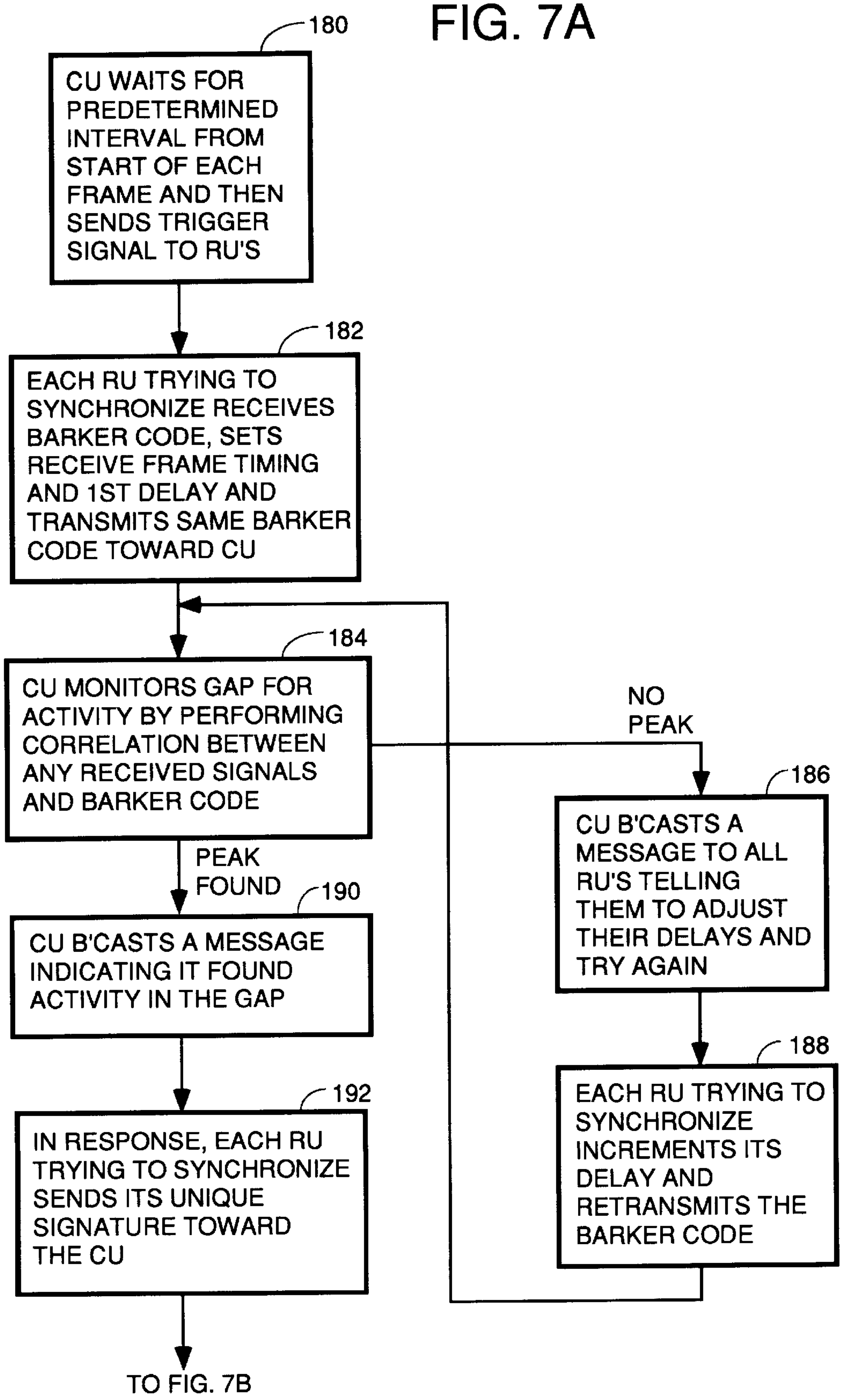
FIG. 7, which is comprised of FIG. 7A, 7B, and 7C, is a flow chart for the general alignment process which is used in training all RUs to set their delay vectors properly so as to be in alignment within the same frame.
Figure 7B:
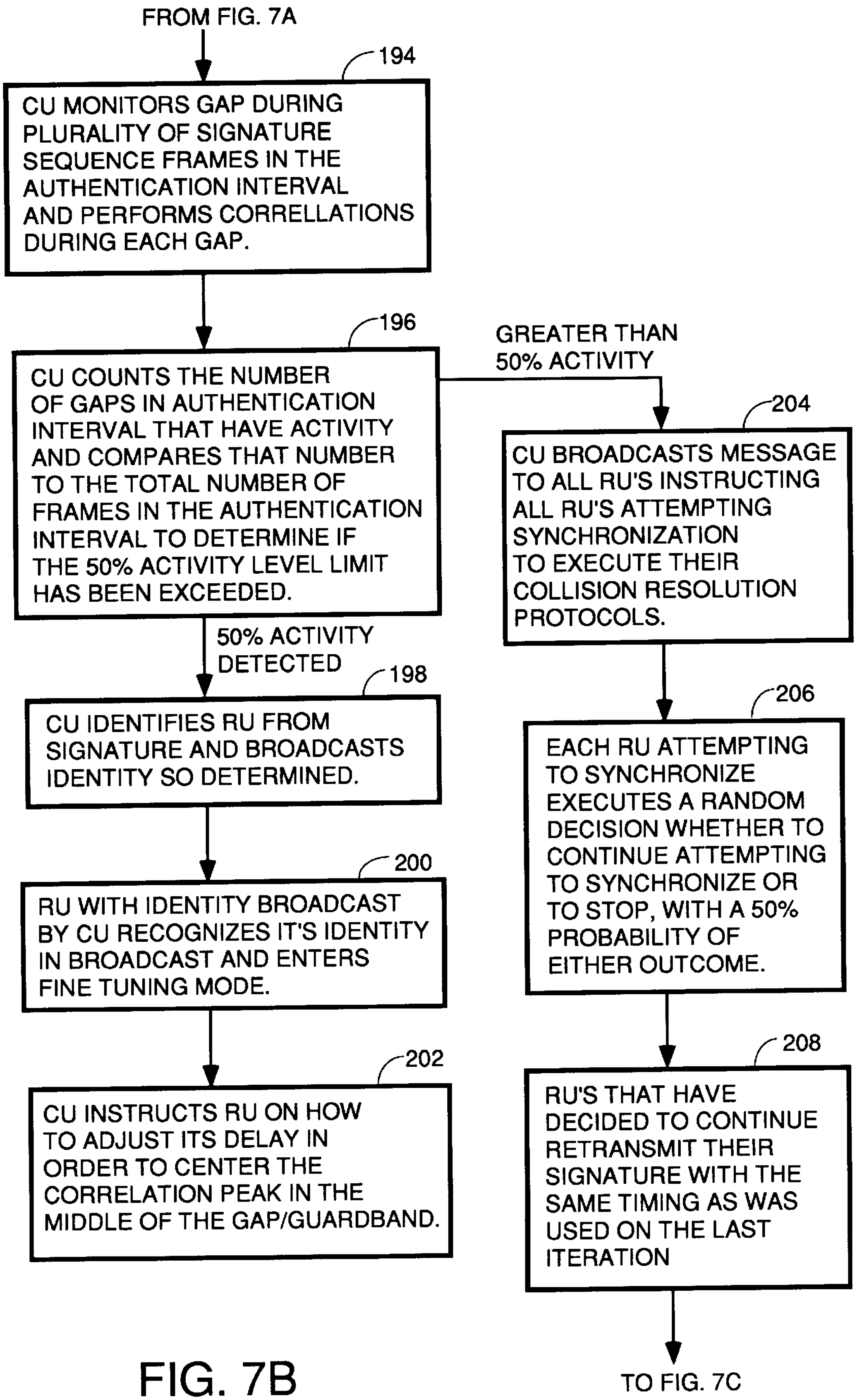
Figure 7C:
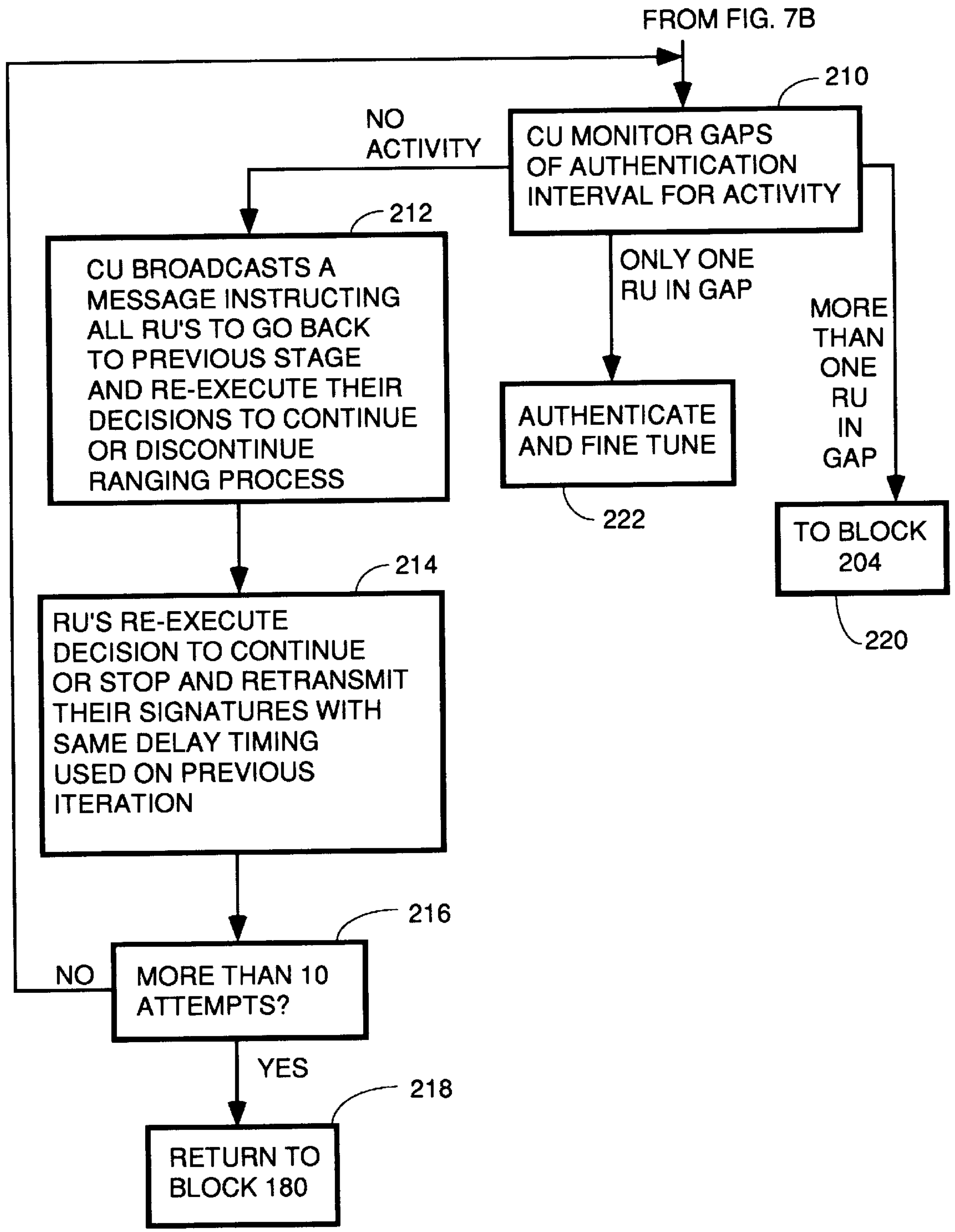

Referring to FIG. 7, which is comprised of FIG. 7A, 7B, and 7C, there is shown a flow chart for the general alignment process which is used in training all RUs to set their delay vectors properly so as to be in alignment within the same frame. The process starts as symbolized at block 180 with the CU waiting for a predetermined interval from the start of each frame and then sending a trigger signal transmission to he RUs. The trigger signal in each frame is a unique barker code.

Block 182 symbolizes the process wherein each RU trying to synchronize (the terms "synchronize", "ranging" and "alignment" all are used synonymously to mean the process of training an RU to set its delay vector properly to get its alignment transmission in the gap) receives the barker code trigger signal transmission from the CU and sets its receive frame timing and then sets a first delay for its delay vector. Thereafter, the RU transmits the same barker code it received from the CU towards the CU as an alignment transmission.

In block 184, the CU monitors the gap for activity by performing a correlation mathematical function between any received signal during the gap and the barker code that was transmitted as the trigger signal. If a barker code identical to the trigger signal is received during the gap, the correlation calculation will result in a correlation peak being found in the gap. If the correlation calculation results in a peak being found, processing proceeds to the process symbolized by block 190. There, the CU broadcasts a message to all RUs indicating that it found activity in the gap. Then the process of block 192 is performed where each RU trying to synchronize sends its signature. That is, in response to the broadcasts from the CU, each RU trying to synchronize sends its unique signature towards the CU in order to determine if that RU's barker code is the barker code the CU found in the gap and whether it is the only RU in the gap. This process is called authentication.

The process of block 192 symbolizes the start of the authentication process. Each RU has a unique signature which comprises the transmission and nontransmission of barker codes during the gaps of a multiple frame authentication period. Specifically, the unique signature of each RU will involve transmitting the barker code during some gaps of the authentication period but not during others. The number of gaps during which the barker code is transmitted compared to the number of gaps during which the barker code is not transmitted during the authentication period is such that if only one RU is aligned to the gap and is transmitting its authentication signature, activity will be found in the gaps of the authentication interval only 50% of the time. This scheme for authentication is chosen so that the CU can detect contentions, i.e., more than one RU in the same gap, in the manner described below.

After performing the process of block 192, the process of block 194 on FIG. 7B is performed. This process involves the CU monitoring each of the gaps during the plurality of signature sequence frames in the authentication interval and performing correlations between the signals received in each of the gaps and the barker code that the CU transmitted.

Next, the process of block 196 is performed. In this process, the CU counts the number of gaps in the authentication interval that have had activity detected therein, and then compares that number to the total number frames in the authentication interval to determine if the 50% activity level limit has been exceeded.

Returning to the consideration of the process of block 184, if the CU, while monitoring the alignment gap for activity, finds no peak resulted from the correlation calculation, then the process of block 186 is performed. In the process of block 186, the CU broadcasts a message to all RUs telling them to adjust their delays and to try again to hit the gap with their barker code transmissions. Then, the process of block 188 is performed wherein each RU trying to synchronize increments its delay vector and retransmits the same barker code as was received from the CU. Thereafter, the process of block 184 is performed again wherein the CU monitors the gap for activity. The loop comprising blocks 184, 186 and 188, taken together, comprise the trial and error process which causes all RUs trying to align themselves to continually increment their delay vectors until at least one of them hits the gap.

Returning to the consideration of block 196, if 50% activity level is detected during the authentication interval, it means that only one RU is in the gap. In such a case, the process of block 198 is performed. In this process, the CU identifies the RU whose barker code transmissions are found in the gap from the unique signature sequence transmitted during the authentication interval. In other words, the CU examines exactly which gaps had correlation peaks therein and the sequence of these gaps and looks up this sequence in a lookup table listing the unique signature sequence for each RU in order to identify the particular RU that has successfully aligned itself. Block 198 is reached only if activity is detected in exactly 50% of the gaps.

After the CU identifies the RU, it broadcasts the identity so determined to all RUs as the last step of block 198.

Next the process of block 200 is performed. In this process, the RU with the identity broadcast by the CU recognizes its identity in the broadcast message and enters a fine tuning mode.

The fine tuning mode is represented by the process of block 202. In this process, the CU instructs the RU which has aligned itself in the gap on how to adjust its delay vector in order to center the correlation peak calculated by the CU to the exact middle of the gap. In the preferred embodiment, the gap is comprised of 16 chips which comprise 8 chips in the middle of the gap and then 4 chips on either side of this middle group of 8. It is desirable during the fine tuning mode to get the correlation peak centered in the middle of the middle 8 chips. As mentioned above, a chip is a small interval of time equal to the frame period of 125 microseconds divided by the 448 chips which comprise each frame. In other words, each chip is 279 nanoseconds in duration. The fine tuning process of block 202 involves sending messages back and forth between the CU and the RU which has been identified as having aligned itself in the gap. These messages are sent over the management and control channels. Usually the exchange involves only one instruction from the CU to the RU saying, for example, "Increase your delay vector by 2 chips" or , "Decrease your delay vector by 3 chips". The RU then makes the instructed adjustment and retransmits the barker code. The CU agains calculates a correlation peak and examines where the peak occurs in the gap. If the peak occurs in a suitable position, the CU sends a message to the RU telling it to stop adjusting its delay vector as satisfactory alignment has been achieved.

Returning to the consideration of the process of block 196, if the CU determines that greater than 50% of the gaps during the authentication interval had correlation peaks therein, i.e., greater than 50% activity is detected, then the process of block 204 is reached. This process is only reached if more than one RU has aligned itself to the same gap. If this case, because each RU is transmitting its unique signature, and because each signature is a unique sequence with only 50% activity level, the result of two RU's being in the same gap will be that during more than 50% of the gaps of the authentication interval, correlation peaks will occur. It is impossible to find tune the RUs if more than one RU is trying to fine tune during the same gap. Therefore, the CU has to reduce the number of RUs that are in the gap to one, and it starts this process by performing the process of block 204. In this process, the CU broadcasts a message to all RUs instructing only the RUs attempting to synchronize to execute their collision resolution protocols.

Next, the process of block 206 is performed, to start the collision resolution protocol, wherein each RU attempting to synchronize executes a random decision whether to continue attempting to synchronize or to stop attempting to synchronize. Each RU will make this decision with a 50% probability of either outcome.

After all RUs make their random decisions whether to continue, the process of block 208 is performed. In this process, the RUs that have decided to continue to align retransmit their signature sequences without changing their timing, i.e., with the same timing as was used on the last iteration of the trial and error process. In other words, each RU that has decided to continue transmits its unique signature sequence (sometimes hereafter called a "dotted sequence") over another authentication interval using the same delay vectors that are currently set.

Next, the process of block 210 on FIG. 7C is performed wherein the CU again monitors the gaps of the authentication interval for activity.

If the random decisions whether to continue or not result in no RUs transmitting their signatures, then no activity will be found in the gaps of the authentication interval. In this event, the process of block 212 will be performed wherein the CU broadcasts a message instructing all RUs to go back to the previous stage and to reexecute their decisions to continue or discontinue the ranging process.

The RUs then re-execute their decisions whether to continue or stop attempting to align themselves and retransmit their signatures during the authentication interval with the same delay timing used on the previous iteration, as symbolized by block 214.

Following the process of block 214, the process of block 216 is performed to determine if more than 10 attempts to get one RU in the gap have occurred. If so, the process of block 218 is performed to return to block 180 and restart the ranging process from the top. If fewer than 10 attempts have been made, processing returns to the process of block 210 wherein the CU again monitors the gaps of the authentication interval for activity.

If the process of block 210 finds only one RU in the gap, i.e., 50% activity level is detected during the authentication interval, then the process of block 222 is performed. The process of block 222 authenticates the RU by broadcasting the identity of the RU found in the gap and then the RU is fine tuned in the manner previously described with reference to block 202.

If the CU finds in the process of block 210 more than one RU is still in the gap, processing returns to block 204 where the CU broadcasts a message to all RUs instructing them to execute their collision resolutions protocols. This process is symbolized by block 220.

The process of adjusting the delay vector used by the CU in transmitting its trigger signal barker code can result in loss of synchronization by all RUs in the system unless something is done to prevent this before the CU changes its delay. That is, when the CU shortens its delay vector, the RUs closer to the CU than the furthest RU will all go out of alignment unless certain measures are taken to forewarn them of the coming change. There are 3 different embodiments of processes for realigning all of the RUs when the CU changes its delay vector. The preferred one of these embodiments is symbolized by the flow chart of FIG. 9 and involves activity prior to the CU changing its delay vector to prevent loss of synchronization by all RUs when the CU changes its delay.

Figure 8:
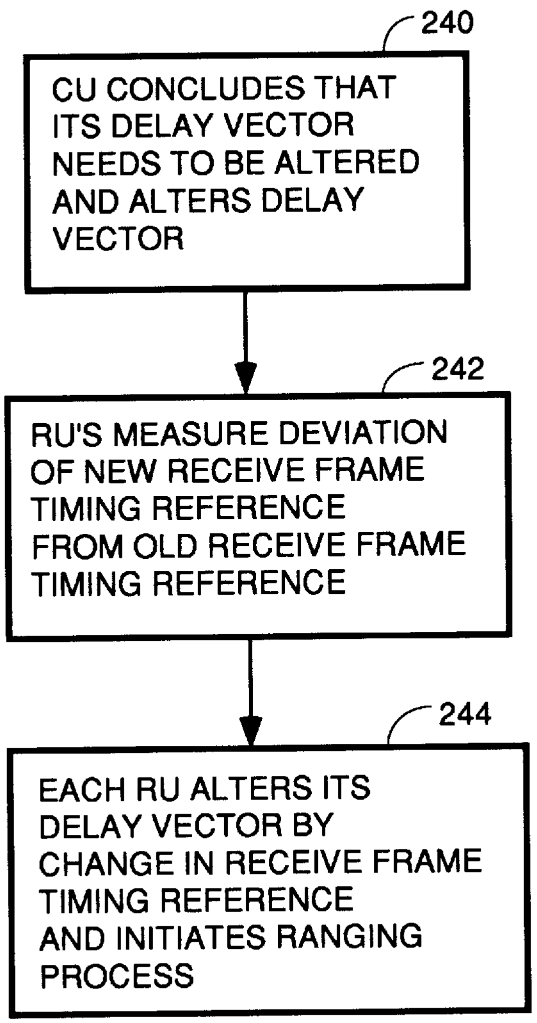
FIG. 8 is a flow chart of one embodiment of a process to resynchronize all RUs after the CU has changed its delay vector.

The first of these processes is shown in the flow chart of FIG. 8. This process will be called the dead reckoning resychronization process for lack of a better term. In this process, the CU concludes, in block 240, that its delay vector needs to be altered in order to keep the farthest RUs in alignment. This conclusion can be drawn in any one of a number of different ways such as by monitoring the farthest RU for continued alignment after the farthest RU tells the CU that it is aligned with the shortest possible delay vector in use. Or, alternatively, the CU can send out a message to the farthest RU periodically inquiring as to whether it is still aligned. This message can take the form of a request for that RU to transmit its authentication signature and then monitoring the next few frames of an authentication interval to determine if that farthest RUs authentication signature shows up in the authentication interval gaps. If the CU concludes in block 240 that it needs to alter its delay vector it then alters the delay vector.

As noted previously, because the CU uses the same delay vector during every frame in transmitting its barker code trigger signal, the RUs have a predictable periodic signal from the CU upon which they can rely to measure the timing change made by the CU. In other words, the time of arrival of the barker code from the CU during each frame is predictable to each RU, and when it changes, the RUs can measure by how much it changed. When the barker code from the CU does not arrive at the predicted time, the RUs know that the CU has just altered its delay vector. The RUs then measure the deviation of the new receive frame timing reference, i.e., the time of arrival of the barker code trigger signal from the CU, by measuring the difference between the old receive frame timing reference and the new receive frame timing reference. This process is symbolized by block 242.

Finally, each RU realigns itself in the process of block 244. In this process, each RU alters its delay vector by an amount equal to the change in the receive frame timing reference. Then each RU initiates a ranging process. The CU monitors the gap at the end of every frame so any RU can initiate ranging at any time.

Figure 9:
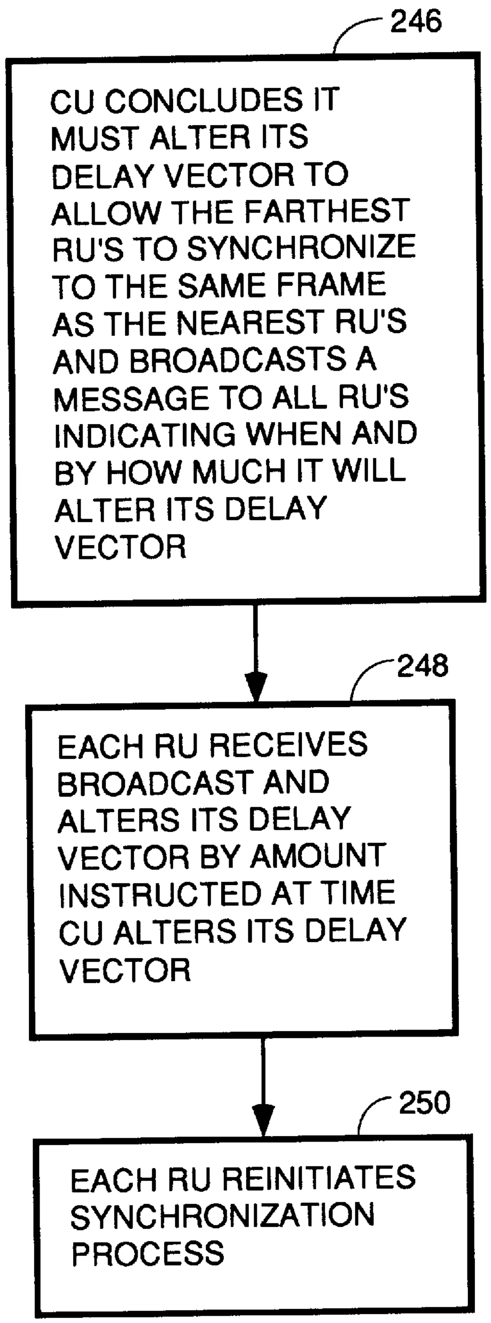
FIG. 9 represents the preferred process for resychronizing all RUs after the CU has changed its delay vector.

FIG. 9 represents the preferred process for resychronizing all RUs after the CU has changed its delay vector. This process will be called the precursor embodiment herein. This process starts with block 246 wherein the CU concludes that it must alter its delay vector to allow the farthest RUs to synchronize to the same frame as the nearest RUs. The CU, after reaching the conclusion that a change in its delay vector must be made, broadcasts a message to all RUs indicating when and by how much it will alter its delay vector.

Next the process of block 248 is performed wherein each RU receives the broadcast and alters its delay vector by an amount equal to the amount that the CU will be changing its delay vector at the specified time. That is, each RU alters its delay vector by the amount instructed by the CU at the time indicated in the message from the CU that the CU will alter its delay vector.

Finally, the process of block 250 is performed wherein each RU reinitiates a synchronization process.

Both of the embodiments of FIGS. 8 and 9 will result in little or no loss of data because each RU resychronizes very rapidly. This result follows because each RU's delay vector is immediately set at the delay needed for synchronization at the time the CU alters its delay vector thereby eliminating the delay of the trial and error incrementation of the delay vectors.

The final embodiment for resychronizing after the CU changes its delay vector is for the CU simply to broadcast the message to all RUs saying, "You must all now realign as I have just changed my delay vector." Each RU then re-enters the alignment process symbolized by FIGS. 7A, 7B, and 7C. This process is repeated by each RU until all RUs are aligned.

Figure 10:
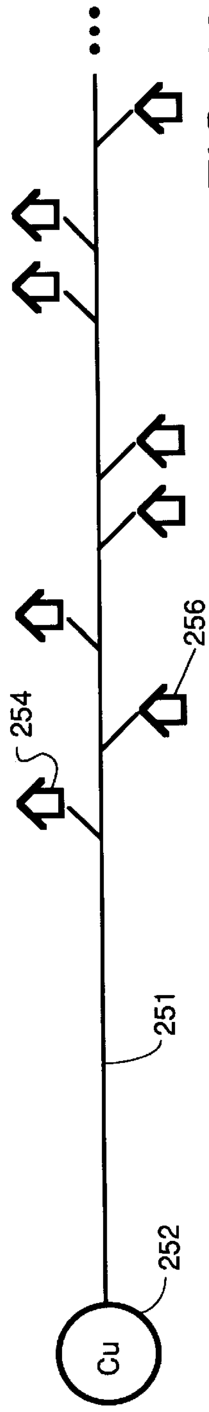
FIG. 10 shows a typical cable television system arrangement in which the teachings of the invention find utility in a multi-RU, multichannel environment.

Referring to FIG. 10, there is shown a typical cable television system arrangement in which the teachings of the invention find utility in a multi-RU, multichannel environment. The central unit or CU 252 is coupled via a coaxial cable, satellite link, microwave link, fiber optic link or some combination of these media 251 to a plurality of subscribers of which subscribers 254 and 256 are typical. The CU sends and receives digital information bidirectionally with each subscriber's RU. Each subscriber has a remote unit or RU which acts as the interface between the subscriber's television, computer, telephone and other devices and the transmission media 251. The CU has a modem therein including circuitry in a transmit channel that assembles frames of data symbols from a TDMA digital data input stream, and encodes and transmits these frames of symbols to the RUs using orthogonal codes. The modem also includes a receive channel which receives the encoded frames of symbols, decodes the symbols using the transpose of the code matrix of the orthogonal codes used by the RU's to transmit the frames, reassembles the TDMA digital data stream from the decoded results and outputs the TDMA stream for use by other equipment providing various services to the subscribers.

Each frame is comprised of symbols that are composed from digital payload data in 128 timeslots in the TDMA stream. Each time slot in the TDMA stream can carry 8 bits in some embodiments, but in the preferred embodiment, each timeslot carries 9 bits for reasons to be described below. Each timeslot is a channel which can carry digital data encoding some service such as video on demand, video teleconferencing, internet access, etc. The timeslots/channels are assigned on an as-needed basis to the various subscriber RUs to transmit/receive data implementing the service in bidirectional communication with the CU.

The choice of 128 payload timeslots per frame is not coincidental. In telephony, a frame of data also comprises 128 timeslots, each carrying 8 bits of data. Each RU is in synchronization with the CU and knows when the beginning and end of each frame of data occurs. Each RU also knows which timeslot(s) has/have been assigned to it by virtue of side conversations each RU has with the channel assignment circuitry in the CU on the command and control channels (the remaining 16 channels of the 144 total channels).

Figure 11:
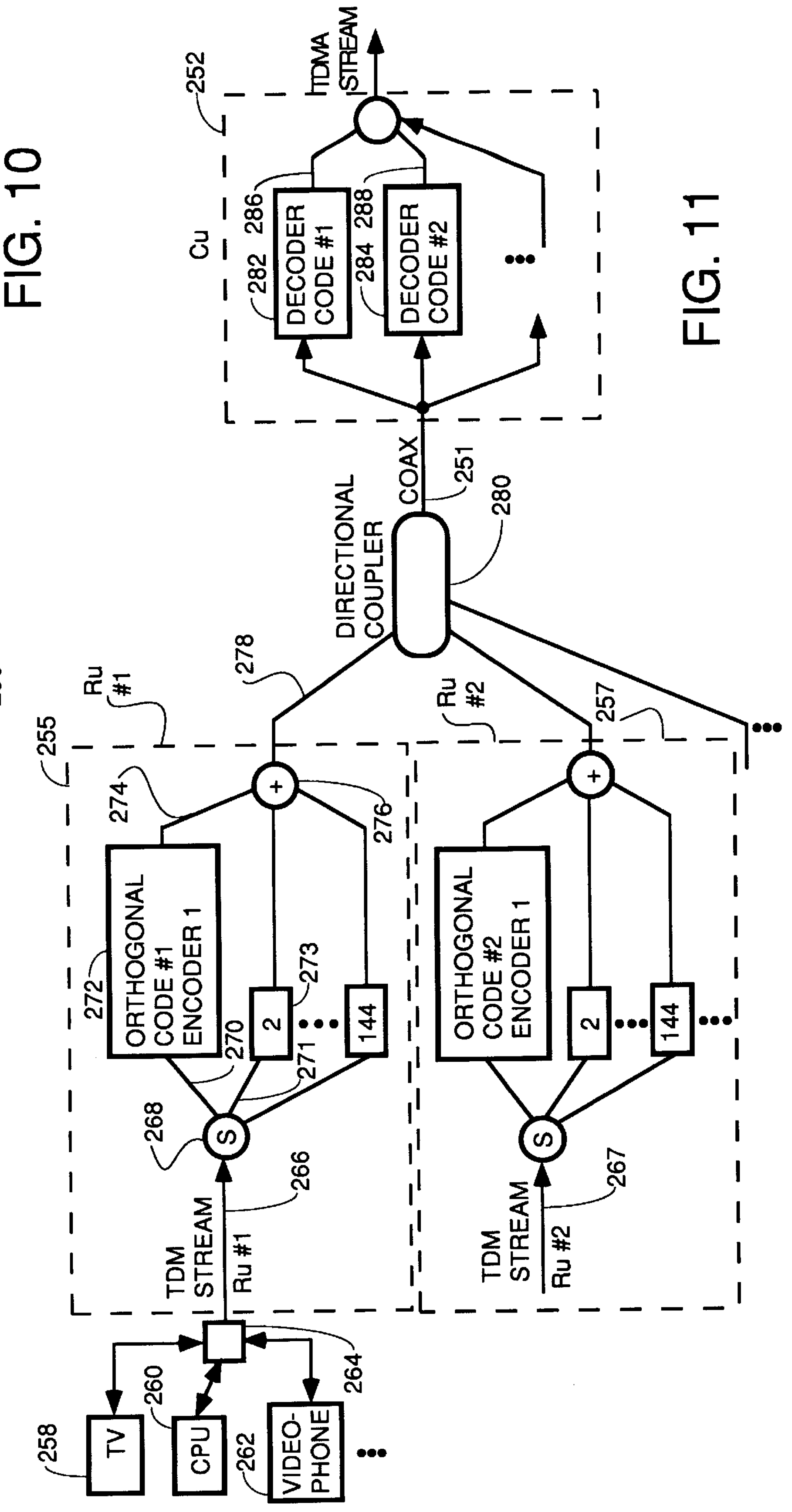
FIG. 11 is a block diagram of one multichannel embodiment for the internal structure of each RU modem's transmit channel circuitry for transmitting data to the CU.

Referring to FIG. 11, there is shown a block diagram of the system of FIG. 10 which shows more detail about one multichannel embodiment for the internal structure of each RU modems transmit channel circuitry for transmitting data to the CU. Dashed box 255 represents RU#1 while dashed box 257 represents RU#2. Each RU receives a time division multiplexed (TDMA) stream of digital data from the various devices that share the communication capability of coaxial cable/transmission media 251. For example, RU#1 is coupled to an interactive television 258, and is also connected to a personal computer 260 and a videophone 262. An interactive television is a modified conventional TV wherein a user can send digital signals to the CU in response to things he or she sees on the television or as requests for specific video selections. Each of these devices has a digital data input/output port which is coupled to a time division multiplexer switch 264. The switch 264 combines data coming in from devices by placing bytes of data from each device into timeslots in a time division multiplexed (TDMA) stream of digital data on line 266. The TDMA stream for RU#2 is on line 267.

Each timeslot/channel can contain 9 bits of which 8 bits are devoted to encoding the data for that channel and 1 bit is used for management and control purposes. The 9th bit can be used as a tiny side channel for side conversations over and above the main data traffic for the channel. In alternative embodiments, any other number of bits per timeslot may also be used.

The 9 bit groups of bits in each timeslot are divided into three 3-bit groups called triple bits or tribits herein. These three triple bits from the time domain are a very short burst of data which get spread out in time in the code domain. The triple bits are spread out over time by selecting three different triple bit columns from an array in a framer memory described below for each incrementation of the read pointer and multiplexing these linear arrays of triple bits through the transmitter circuitry. The three columns of triple bits of each frame each span all 144 time slots of the TDMA input streams.

All symbols generated for the first frame for all active channels are encoded using orthogonal codes, and the results are combined for simultaneous transmission over the shared transmission media using a synchronous CDMA modulation scheme.

Each RU is capable of receiving data in up to 144 of the timeslots in the input TDMA stream and is capable of getting all that data to the CU. However, only 144 total channels are available for all RUs to share, so rarely does one RU use all 144 channels. Each RU requests the number of timeslots or channels it needs to provide services requested by the subscriber. This request is sent via a message on a command and control channels to the CU. The CU then sends a reply message telling the requesting RU which channels have been assigned to it. The CU will not assign the same channel to multiple RU's.

Each RU then uses the appropriate orthogonal codes in the encoders coupled to receive the data from the timeslots to which it has been assigned. For example, if RU#1 is assigned channels 1 and 2, and RU#2 is assigned to channel 3, RU#1 will use orthogonal codes #1 and #2 in the encoder coupled to receive the data in timeslots 1 and 2, and RU#2 will set orthogonal code #3 into the encoder coupled to receive the data from timeslot 3. That is, one orthogonal code is assigned to each payload channel and each command and control channel in the embodiment shown in FIG. 11.

The transmit channel of each RU of the embodiment shown in FIG. 11 has a splitter like splitter 268. The purpose of this splitter in transmitting data to the CU 252 is to split out the data in each time slot of the time division multiplexed incoming data stream and apply the data from each time slot to one of a plurality of orthogonal code encoders for encoding using one orthogonal code from the code set used on the system. For example, in the hypothetical given above, the data from time slot #1 is output from the splitter on line 270 which is coupled to the data input port of orthogonal code #1 encoder 1, block 272, and the data from time slot 2 is sent via line 271 to encoder #2, block 273. The encoder 272 encodes the channel 1 data from time slot 1 using code #1 of the orthogonal code set in use in the system (actually, one row of the code matrix that defines the entire code set), and outputs the resulting modulated signal on line 274 which is coupled to one summing input of a summer node 276. Encoder #2, block 273, encodes the data from channel 2 in time slot 2 using code #2 from the orthogonal code set (a different row of the code matrix—rows or columns of the code matrix may be used interchangeably in the matrix multiplication of the transmit process so long as the matrix multiplication of the received signal vector times the transpose matrix is the opposite, i.e., if rows are used on the transmit side, columns are used on the receive side).

A controller circuit (not shown) in each RU which is coupled to communicate with the CU over a management and control channel and which is also coupled to each of the orthogonal code encoders, receives the channel assignments for the RU and selects the unique orthogonal code for the channel assigned. The controller circuit then controls each encoder to use the appropriate orthogonal code assigned to the channel when encoding data for that channel. Each encoder in the RUs which is active must use a different, unique, orthogonal code. No encoder will use the same code as another "active" encoder. An "active" encoder is an encoder which has been assigned to encode a particular channel for its RU.

After the data from the appropriate timeslot is parsed out of the TDMA stream by the splitter 268 and guided to the proper encoder and the proper orthogonal code is selected for use in the encoder, the data in the assigned timeslots/channels for each RU is encoded. This is done using the appropriate orthogonal codes assigned to those channels. The results are then transmitted to the CU simultaneously from all RUs over the shared transmission media 251. More precisely, the energy representing the data from the various timeslots/channels is spread out over the entire 125 microsecond duration of the frame by the action of the encoders. Because the data from the various timeslots is encoded using orthogonal codes, no interference between the data occurs during transmission of the encoded symbols in the code domain.

There is one encoder for each timeslot in each RU in the embodiment shown in FIG. 11. Each encoder spreads out the energy from its assigned channel over all the chips in the frame. Each encoder in each RU has its encoded output signal coupled to a summing input of a summer like summer 276. The function of the summer in each RU is to sum all the encoded signals and output them on a subscriber branch coaxial cable or other transmission media like branch cable 278. The transmission media like branch 278 are coupled through a directional coupler like coupler 280 to the main coaxial cable/transmission media 251. The combined output signals from each RU are added to the composite signal on the main coaxial cable by one or more directional couplers symbolized by coupler 280.

At the CU, the code domain signals on shared transmission media 251 are decoded by the decoders 282, 284 etc., and the resulting data is put back into the appropriate timeslots in the time domain TDMA data streams for output to the various equipment that is providing the requested services.

At the CU 252, the composite signal received from transmission media 251 is distributed to each of a plurality of decoders. A decoder for channel 1 is represented by block 282. This decoder uses the transpose of the code matrix which was used to encode the channel 1 data to extract any channel 1 information encoded into the composite signal by RU#1 (or whatever RU was assigned to channel 1). This decoding is done in the manner described previously in the discussion of FIGS. 1–3.

Likewise, the decoder for channel 2, represented by block 284, using the transpose code matrix to decodes any channel 2 information encoded into the composite signal by RU#2. In the embodiment of FIG. 11, there is one decoder in the CU for each channel in use, and each decoder uses the appropriate column of the transpose matrix $[c^T]$ corresponding to the code used by the corresponding RU to encode the channel being decoded. The resulting decoded digital signals are output on lines 286 and 288 to a switch which reassembles these digital signals to reproduce a composite of the time division multiplexed data streams which entered the RUs on lines 266, 267 etc.

In the embodiment shown in FIG. 11, only the transmit channels are shown and individual encoders are shown for each channel. In a more practical embodiment, only a single encoder is used in each transmit channel in each modem. This encoder is time shared to encode the data from the various timeslots. Usually, the single encoder is a suitably programmed microprocessor. Each RU modem also has a receive channel (not shown) which is structured similarly to the receive channel circuitry in the CU shown in FIG. 11. In some embodiments, the decoding in the receive channel and the encoding in the transmit channels are both done using a single microprocessor which has been suitably programmed. The choice of whether to use a shared microprocessor or multiple individual channels of hardware is largely dependent on data rate and cost considerations. If the data rates are high, multiple individual channels may be required. If data rates are low enough to use a shared microprocessor and cost is to be minimized, the shared microprocessor is preferred.

Typically, one RU will use less than all the 128 payload channels, but if one RU or a handful are using all 128 channels, no other RU can be awarded any bandwidth since only one RU can be on any particular channel at any particular time. Obviously, the orthogonal code set selected must have at least 128 codes. However, in the preferred embodiment, there are 128 data channels plus 16 management and control channels, for a total of 144 channels. Of the 16 management and control channels, 4 are access channels which carry traffic from the RUs to the CU requesting bandwidth and relinquishing awarded channels after the RU is finished using the channels awarded by the CU. Because there are 144 separate channels, an orthogonal code set having at least 144 unique, orthogonal codes must be used. Each channel has a maximum 72 kilobits per second data capacity in the preferred embodiment.

Channel allocation by the CU can take any one of a number of different forms. For example, the RUs could have a fixed allocation of channels or channels could be awarded in any number to any RU based upon need where the CU polls the individual RUs for their needs or the RUs transmit their needs asynchronously to the CU and the CU arbitrates between the requests to allocate the available channels. Likewise, one RU may have security considerations that require one channel to be dedicated to it at all times and no other RU is allowed to be on that channel as controlled by channel awards by the CU given in messages to the individual RU's. Alternatively, some channels can be made available for all RUs to use with the RUs themselves resolving contentions. In the preferred embodiment, there are four channel allocation schemes which are implemented either individually or in any combination in the CU channel allocation circuitry: (1) a reservation scheme where the RUs bid for bandwidth and the CU reserves certain channels to each of the RU's; (2) a contention mechanism where the RUs are notified by the CU of what channels are available to all RUs for traffic, and where the RUs transmit on those channels at will with contentions detected by the CU and contention notification messages to the RUs in contention to enter contention resolution procedures; (3) polling where the CU inquires of each RU sequentially whether it needs bandwidth and awards bandwidth as needed as determined from the polling with arbitration when not enough channels are available to meet all requests; (4) fixed allocation of the available channels to specific RU's. In the preferred embodiment, all four schemes can be used individually at times or any combination of the schemes can be used at times. Which channel allocation schemes are in use at particular times is established by the configuration data set up by the user. For example, one fourth of the channels may be put on a reservation scheme, one fourth of the channels may be left for contention, one fourth of the channels may have fixed allocation and the last fourth of the channels may be reserved for polling allocation. Each of these different mechanisms for allocation of bandwidth is believed to be known, standing alone. However, the applicant's believe it is new to provide a CU that can use any one of these methods or any user programmable combination of all four methods for user programmable groups of channels, all as established by entry of configuration data by a user during a configuration process.

Since the channel allocation mechanism is centralized in the embodiment of FIG. 11, the RUs have no burden other than to ask for the bandwidth they need. However, in alternative embodiments, the RUs may "bid" for channel allocations and some arbitration process carried out locally in the RUs may resolve any contentions.

By using spread spectrum modulation on the main coaxial cable 251, all the problems associated with pure time division multiplexing or pure frequency division multiplexing on such shared transmission media are avoided. In addition, use of the synchronous CDMA multiplexing and modulation technique with channels assigned on a non-fixed, flexible as-needed basis according to the teachings of the invention eliminates the waste of the so-called synchronous time division multiplexing schemes. In synchronous time division multiplexing schemes, each RU would have a fixed assignment of time slots, and those time slots would be transmitted even if they were empty, i.e., the RU had no traffic to send or receive during some or all of its time slots. Synchronous TDMA multiplexing schemes are described in "Data and Computer Communications" by Dr. William Stallings, at page 211–213, Macmillan Publishing Co., New York (4th Ed. 1994) ISBN0-02-415441-5 which is incorporated by reference herein.

Figure 19:
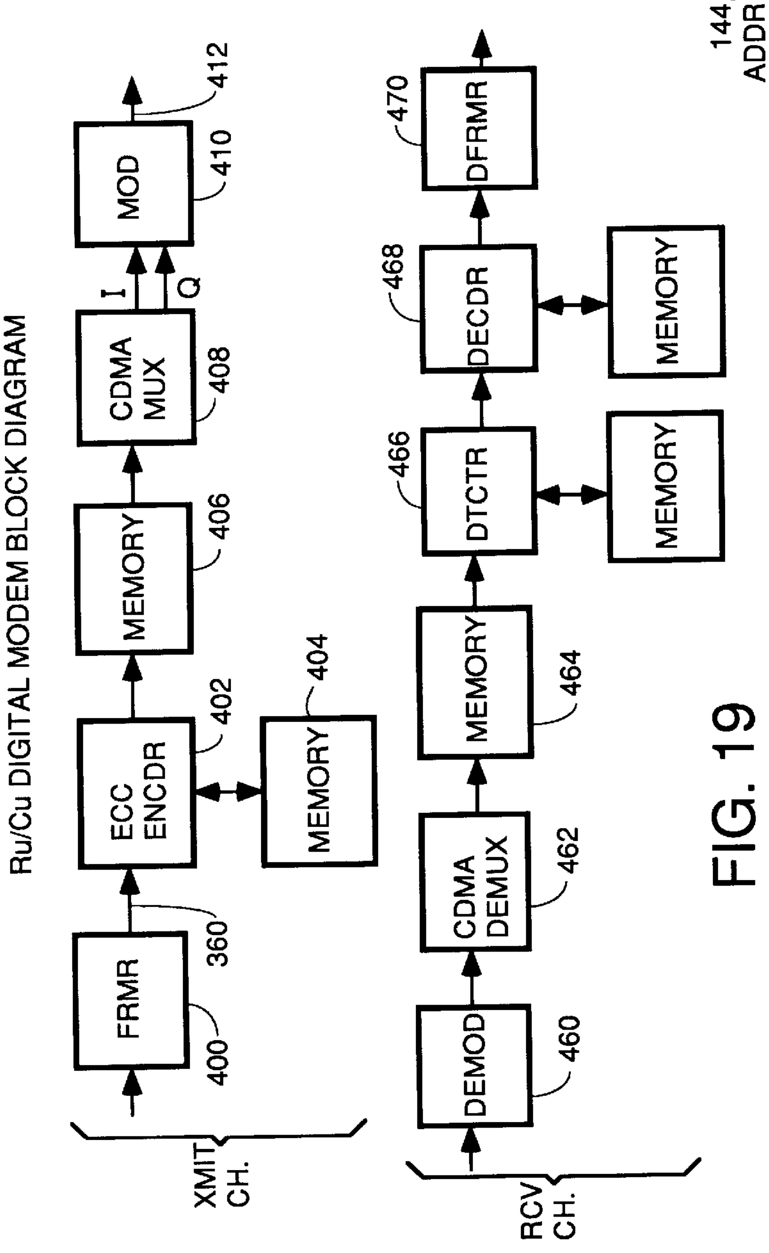
FIG. 19 is a block diagram of the preferred embodiment of the transceiver circuitry included in each RU and CU.

Referring to FIG. 19, there is shown a block diagram of the preferred embodiment of a transceiver for use in the modem of each RU and CU. The transmit channel of the transceiver uses a framer 400 to compose from the TDMA data stream the symbols of each frame for encoding and transmission. The output data stream from the framer is an array of tribits that span the entire 144 timeslots, with three such arrays presented during each frame. Each tribit is a symbol in a frame for transmission.

In the preferred embodiment, the circuitry of the transceiver is virtually all digital, so the arrays of tribits are true arrays of elements which are used sequentially in the matrix multiplication of orthogonal encoding.

In analog embodiments, the arrays of tribits will be streams of tribits, with three separate streams per frame.

Before finishing the description of the rest of the transceiver circuitry in FIG. 19, the framer circuit 400 will be described in more detail. The RU's and CU all utilize framer circuitry to implement the delays needed to transmit data in synchronization to each other. The framer is comprised of a FIFO memory and supporting circuitry that stores incoming digital data from the time division multiplexed data stream received by each RU and CU. The symbols of each frame are composed by outputting the data for from the FIFO memory in a different way than it was loaded during each frame. The basic idea is to pass the 9 bit groups of each time slot through the analog of a FIFO delay line implemented by a memory so as to simultaneously implement the delay imposed by each RU and CU needed for synchronization while providing a convenient way to compose the symbols of each frame from the data in the TDMA data stream.

Figure 12:
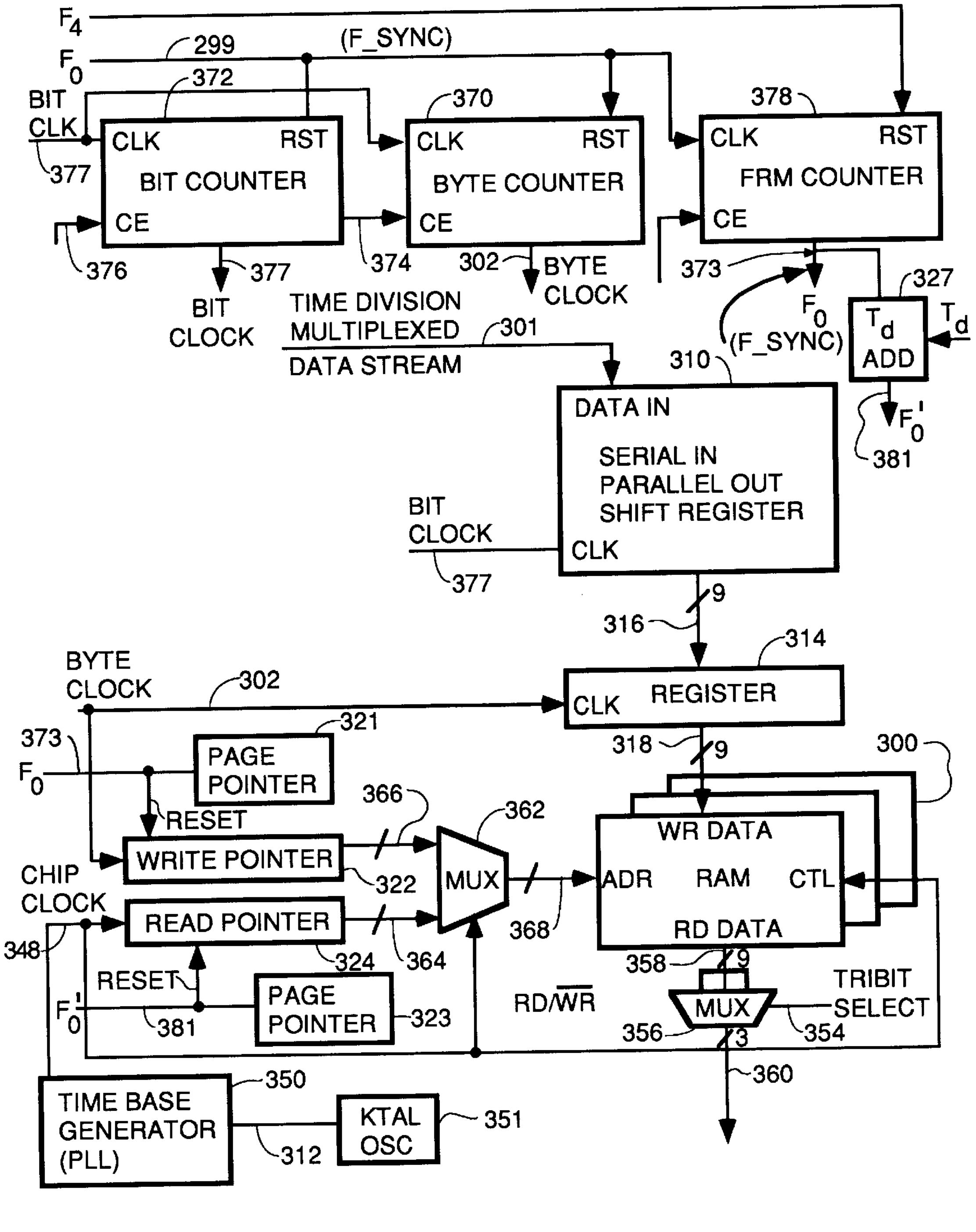
FIG. 12 shows the circuitry that implements the framer in the preferred embodiment.
Figure 13:
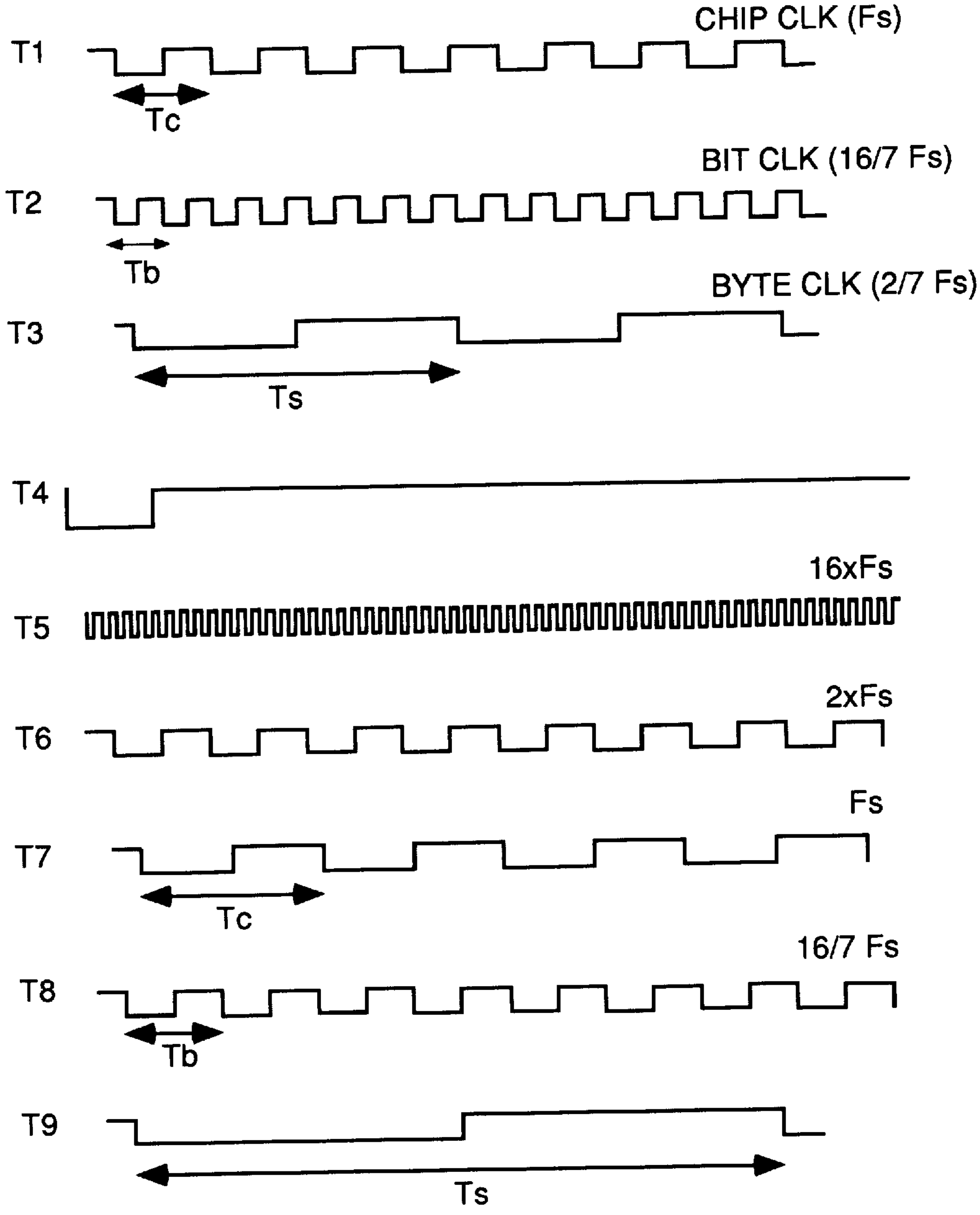
FIG. 13 shows the timing relationships between the chip clock signal which sets timing in the code domain and the bit and byte clocks which set timing in the time domain.

FIG. 12 shows the circuitry that implements the framer in the preferred embodiment, and FIG. 13 shows the timing relationships between the chip clock signal which sets timing in the code domain and the bit and byte clocks which set timing in the time domain. FIG. 13 also shows a number of other signals generated by time base generator 350. The basic period from which all other signals are generated is the chip clock signal shown on time line T1 of FIG. 13. The relationships between the periods of the various signals in FIG. 13 is shown in parentheses at the right edge of each signal. For example, for the bit clock signal shown on time line T2 of FIG. 13, for every 7 periods of the chip clock signal, there are 16 periods of the bit clock signal. For every 7 periods in the chip clock signal, there are two periods in the byte clock signal shown on time line T3 in FIG. 13. Handling of the TDMA stream is synchronized to the bit clock and byte clock signals.

Figure 18:
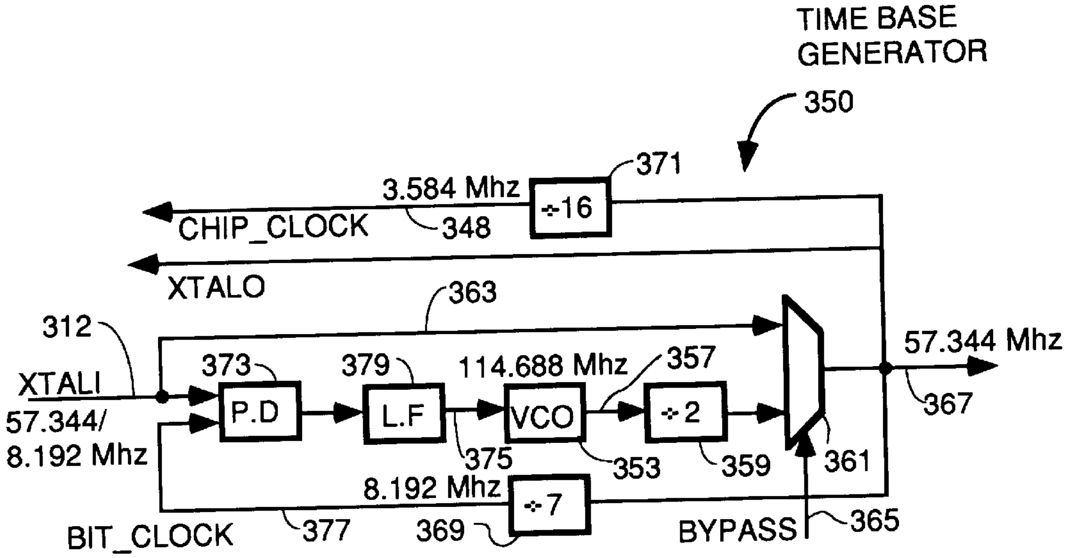
FIG. 18 is a block diagram of the time base generator.

The chip clock signal on line 348 of FIG. 12 is generated by a time base generator PLL 350 and is synchronized with the TDMA data stream by the action of the PLL in keeping both the chip clock and bit clock signals synchronized with the crystal oscillator reference signal. A block diagram of the time base generator 350 is shown in FIG. 18. A voltage controlled oscillator 353 operating at a frequency of 114.688 Mhz sets the basic operating frequency. The output frequency of the VCO on line 357 is divided by two by a divide-by-two counter 359. The result is coupled to one input of a multiplexer 361. The multiplexer has as its other input the crystal controlled oscillator frequency on line 363. The multiplexer switching is controlled by a bypass signal on line 365 so as to normally select the output of the counter 359 and couple it to output line 367. The PLL time base generator generates the bit clock signal on line 377 by dividing the frequency of the signal on line 367 by a factor of 7 in a divide-by-seven counter 369 to generate a bit clock signal on line 377 having a frequency of 8.192 Mhz. The chip clock signal on line 348 is generated by dividing the frequency on line 367 by a factor of 16 in a divide-by-16 counter 371 to generate a chip clock signal having a frequency of 3.548 Mhz. The bit clock and chip clock signals are kept synchronized to the crystal frequency by a phase detector 373 which compares the phase of the crystal signal to the phase of the bit clock signal and outputs a signal which is coupled to the frequency control input 375 of the VCO through a low pass filter 379. The bit clock signal and phase detector causes the PLL to force the transitions of the chip clock signal to line up properly with the bit clock transitions in the relationship of 16 periods of bit clock for every 7 periods of chip clock.

The relationships between timing in the time domain and timing in the code domain are as follows:

There are 144 total time slots or channels in the TDMA stream, of which 128 are payload time slots and 16 are management and control time slots;

Each time slot or channel in the TDMA streams carries 9 bits of digital data synchronized with the bit clock;

One time slot worth of data or 9 bits is stored in the framer for each cycle of the byte clock;

1 frame=144 times slots, each with 9 bits plus 16 chips for the alignment gap;

1 frame also equals 3 symbols plus the 16 chip periods of the alignment gap=448 chip periods;

1 symbol=144 chip periods;

1 gap=16 chip periods;

For every 16 bit clock periods, there are 7 chip clock periods, and for every byte clock period, there are 9 bit clock periods.

To implement the delay necessary in each RU transmit channel circuitry to maintain frame synchronization, consider the following with reference to FIG. 12. The data stream coming into the framer circuitry during each time slot is stored in a different address in memory 300 in FIG. 12 at the data rate of the byte clock signal on line 302. The byte clock signal on line 302 is generated by a byte counter 370 shown at the top of FIG. 12 which generates a byte clock signal transition on line 302 every 9 cycles of the bit clock signal on line 377 from the time base generator 350. Data from the time slots/channels in the time division multiplexed stream of serial data on line 301 is shifted serially into a serial-in, parallel-out shift register 310 at the bit clock rate of the signal on line 377. The byte clock signal on line 302 causes a register 314 to store the current 9-bit, parallel format output of the shift register on bus 316 after each 9 new bits are shifted into shift register 310.

The 9 bit parallel format output of the register 314 is presented on 9-bit bus 318 to the write data input port of memory 300. Thus, a new 9-bit group of data from the TDMA stream is presented for storage on each cycle of the byte clock signal. Each 9-bit group of data from the TDMA stream is stored in a different memory location of memory 300 as will become clear from the discussion of the address generation circuitry described below.

Data is read out of memory 300 at the same rate at which it was stored, but starting at some programmable time after the data is stored, thereby implementing the variable delay needed to maintain frame synchronization with the CU frame timing. This programmable delay $T_d$ is set by the difference in addresses between the address stored in a receive frame counter (read pointer) and the address stored in a transmit frame counter 324 in FIG. 15 (write pointer).

Figure 16:
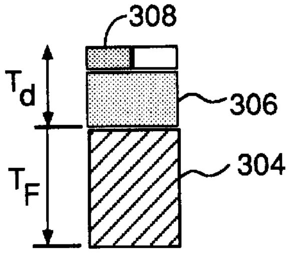
FIG. 16 represents portions of memory 300 with the stippled portion representing the number of addresses difference between the position of the read pointer and the position of the write pointer to implement the delay.

To illustrate this concept, FIG. 16 represents portions of memory 300 with the stippled portion representing the number of addresses difference between the position of the read pointer and the position of the write pointer to implement the delay $T_d$. The cross hatched portion 304 represents one frame of 9-bit bytes while the stippled portions 306 and 308 represent the amount of the delay $T_d$ where portion 306 represents a portion of the delay $T_d$ expressed in full 9-bit bytes, and portion 308 represents the remainder of the delay $T_d$ expressed as part of a byte. In other words, the delay $T_d$ may be some fraction of the number of bit clocks making up an entire 9-bit byte. This is because the delay needed to maintain frame synchronization may not work out to be an integer number of byte clocks.

Figure 15:
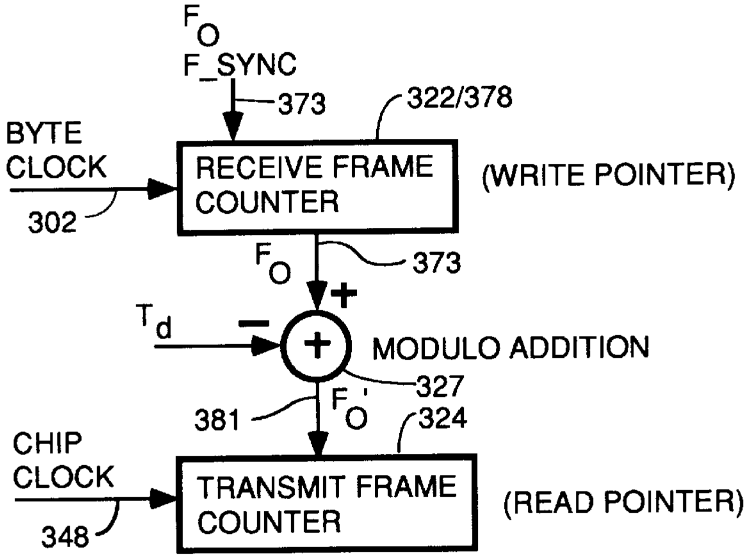
FIG. 15 is a diagram illustrating in block diagram form how the delay necessary in each RU and CU to maintain frame synchronization system-wide is achieved.

FIG. 15 shows how the time delay $T_d$ is implemented using a receive frame counter 322/378 that generates the write pointer address controlling where incoming data is stored in the memory 300 and a transmit frame counter 324 that generates a read address pointer that controls the read address from which data is read for transmission. The F_sync signal on line 326 resets the write pointer in receive frame counter 322/378 to zero at the beginning of each new frame. A modulo adder 373 adds the number of chip clocks based upon the desired time delay $T_d$ to the output write pointer on bus 328 and inputs the result into the transmit frame counter 324 as the read pointer. The value of $T_d$ is varied on a trial and error basis during the synchronization process until the gap is hit and the CU sends a message to whatever RU is synchronizing telling it to freeze $T_d$ at the value that caused the gap to be hit by the barker code.

Figure 14:
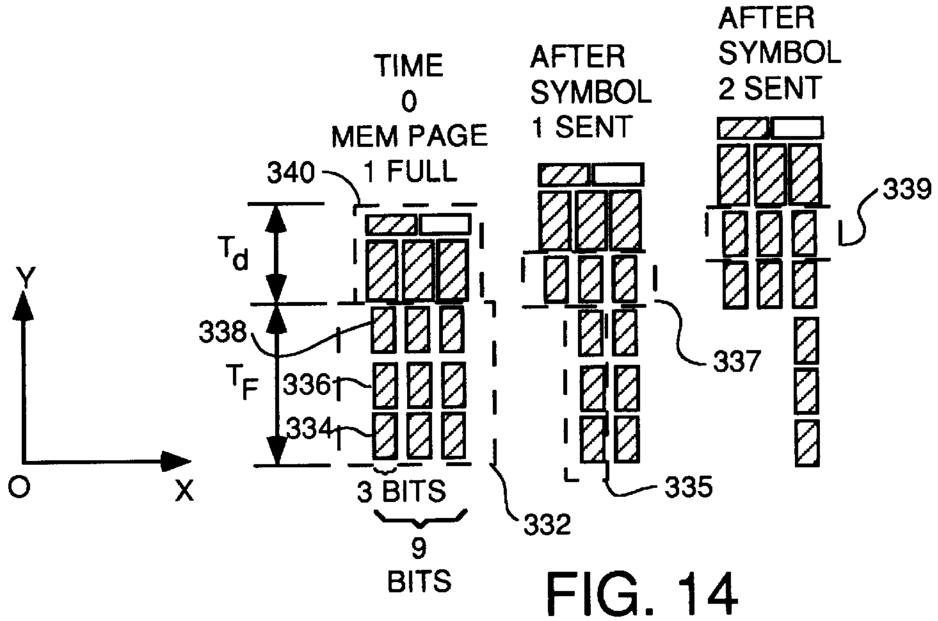
FIG. 14 is a memory filling diagram that illustrates how entire 9-bit bytes are received continuously, but 3 bit tribits for each of 128 data channels are sent out simultaneously to compose the symbols of each frame.

FIG. 14 is a memory filling diagram that illustrates how entire 9-bit bytes are received continuously, while 3-bit tribits for each of 144 channels are sent out simultaneously to compose the symbols of each frame. FIG. 14 graphically illustrates how the frame memory 300 fills and is emptied during this process. Frame memory 300 has 144 memory locations corresponding to the 144 channels of the system on each of three pages. While one page is being filled, another page is being simultaneously emptied at the same rate. Each memory address on each page can store the 9 bits of data from one of the 144 time slots in the TDMA stream. 16 memory locations on each page are reserved for the storage of management and control data to be sent across the 16 management and control channels. In FIG. 14, address numbers increase with an increasing Y coordinate.

At time (0) in FIG. 14 (the leftmost column), page one of the memory is shown as completely full with one frame of data comprised of three vertical columns of three crosshatched blocks apiece. Each column of three blocks, such as blocks 334, 336 and 338 represent one symbol, each symbol having 48 tribits therein. The middle column of FIG. 14 represents the state of fill of the memory after transmission of the first symbol comprised of blocks 334, 336 and 338. The rightmost column of FIG. 14 represents the state of fill of the memory after transmission of symbol 2 comprised of blocks encircled by dashed line 335.

The width along the X axis of each individual crosshatched block in FIG. 14 is equal to the 3 bits of a tribit, and the entire width of a column of blocks is equal to the 9 bits of a time slot. The positive x direction represents increasing time in the time domain. In other words, the first 9-bit byte that is stored is stored in the lowest row of the lowest three blocks in the left column with increasing time in the TDMA stream extending from left to right.

The blocks surrounded by dashed line 332 in the leftmost column represent 144 memory locations, each storing the 9 bits from one of the 144 time slots in one frame of data. The three crosshatched blocks 334, 336 and 338 represent the first symbol of the first frame, each symbol storing 48 tribits. Note in the middle column, after transmission of the first symbol in the frame, these three blocks are gone. Note also that the data of symbol 1 is read out of the memory “across time”, i.e., along the y axis, thereby interleaving the data from the first tribits of individual channels in the time domain into different temporal relationships in the code domain and spreading out the energy of the time slot data over the entire frame interval. This is part of the teaching of code division, multiple access or CDMA modulation schemes.

The three blocks within dashed box 335 in the middle column of FIG. 14 represent the second symbol of data that is to be transmitted in the first frame. Note that these three blocks are gone in the rightmost column representing the state of page one of the memory fill after transmission of the second symbol.

While the first and second symbols are being transmitted, another page of the memory 300 continues to fill up as the data from new timeslots is received. For example, while symbol 1 from page 1 of the memory is being transmitted during the first frame, the data in the three blocks encircled by dashed line 337 in the middle column is received in page 2 of the memory and stored. Thus, while one third of the data from page 1 is read and transmitted, one third of page 2 of the memory is filled with new data. Likewise, while the second symbol of page 1 is being transmitted, the data represented by the three blocks encircled by dashed line 338 in the right column is received and stored in page 2 of the memory.

The blocks encircled by dashed box 340 represents the delay $T_d$ implemented by modulo adder 327 in FIG. 15 and the 16 chip alignment gap.

Figure 17:
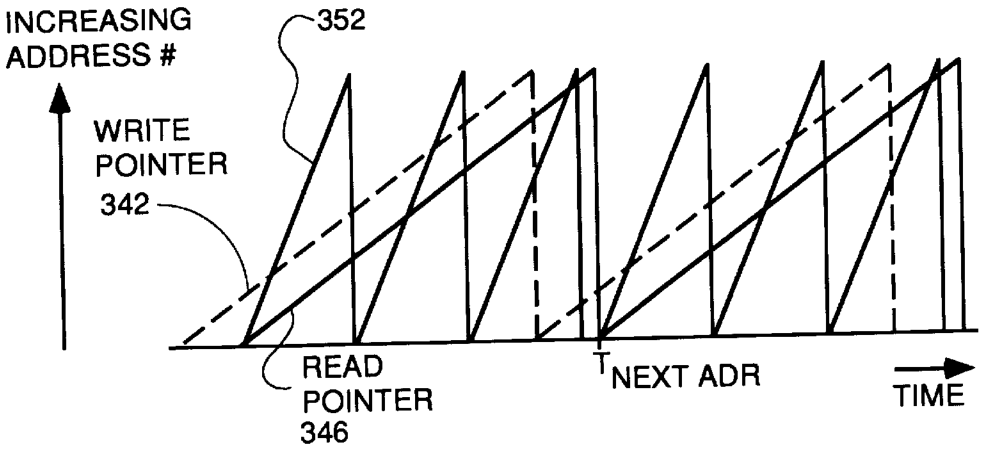
FIG. 17 is a timing diagram showing the relative rates of incrementation of the read and write pointers in the framer.

FIG. 17 is a diagram of the relative rates of address incrementation of the read and write pointers used to manage the framer buffer memory 300 including the relative timing of address incrementation for reading the tribits. Dashed line 342 represents the rate of address incrementation of the write pointer generated by counter 322/378 in FIGS. 12 and 15. This counter counts transitions in the byte clock signal on line 302 in FIG. 12, with the byte clock signal shown on time line T3 in FIG. 13. Every cycle of the byte clock signal causes register 314 in FIG. 12 to latch a new 9-bit byte therein and present it on bus 318 to the write data port of two-port memory 300. Every cycle of the byte counter also causes write pointer counter 322 in FIG. 12 to present a new write pointer address on bus 366 for use in controlling where the data on bus 318 is stored. A multiplexer 362 having its output coupled to the address port of memory 300 and having as its inputs the write pointer on bus 366 and the read pointer on bus 364 is suitably switched so that the write pointer and read pointer addresses are presented at the appropriate times at the address port to implement the memory filling and memory reading operations described herein.

The bit clock signal on line 377 in FIG. 12 is used to clock the serial-in, parallel out shift register 310. The bit clock signal is generated by the time base generator shown in FIG. 18 and is counted by a modulo 9 bit counter 372 shown at the top of FIG. 12 for purposes of helping generate the byte clock signal on line 302 in FIG. 12. This counter 372 counts the bit clock signal on line 377 from time base generator 350 modulo 9 and outputs a transition to logic 0 on line 374 after every 9th bit period. The transition on line 374 acts as a count enable signal to byte counter 370 to enable incrementation of the byte counter 370 by the next bit clock cycle. This generates the byte counter signal on line 302. The bit counter 372 is always enabled by the hard wired count enable signal on line 376. Both the bit counter and the byte counter are reset to 0 by asserting the $F_0$ signal on line 373 for fast resetting/resynchronization of the system. The $F_0$ signal occurs at the end of each frame, and is also called the F_Sync signal in FIG. 15. This signal indicates when the gap at the end of each frame is transmitted by the CU has been detected at the RU. The $F_0$ signal is generated by a portion of the time base generator not shown in FIG. 18, and is counted as a clock signal by frame counter 378 which outputs a synchronized $F_0$ signal on line 373. The frame counter 378 is reset every 4th frame by a super frame signal $F_4$.

The time delay $T_d$ necessary for hitting the alignment gap with a barker code transmission is added to the $F_0$ signal on line 373 by the modulo adder 327 to generate the $F_0'$ signal on line 381. The $F_0$ signal on line 373 also increments the page pointer 321 for the write pointer and simultaneously resets the write pointer 322 to zero at the end of each frame so as to begin writing again at address 0 of the next page.

The delayed $F_0'$ signal on line 381 increments the page pointer 323 of the read address circuitry and simultaneously resets the read pointer counter 324 to zero so as to begin reading at address 0 of the next page at the end of the frame. The read pointer counter 324 is incremented by the chip clock signal on line 348 so as to provide read addresses from which the tribits of each symbol are read.

Returning to the consideration of FIG. 17, solid line 346 represents the rate of emptying the frame memory 300 in FIG. 12. This rate of emptying is based upon incrementation of the read pointer counter which counts the chip clock signal on line 348 from time base generator 350. Since each symbol stores 144 tribits from 144 different channels and since there are three symbols and a 16 chip gap in each frame, the total number of chips in a frame is 448. Since all the 432 tribits of all three symbols of the frame must be read out while the byte counter is counting to 144 to store a frame's worth of 9-bit bytes of data from 144 channels or time slots, the read pointer is incremented on the chip clock signal. This causes all 432 tribits from all three symbols of a frame to be read out while the next frame of data is being stored thereby preventing overflow of memory 300. This is why the read pointer line 346 in FIG. 17 is shown as emptying the memory at the same rate as the write pointer fills it.

Line 352 in FIG. 17 represents the rate of incrementation of the read pointer counter 324 in FIG. 12. The read pointer counter increments on each cycle of the chip clock signal such that it increments from 0 to 143 during the time to read all the tribits from the first symbol. This has the effect of causing the 9 bits of data from each of the 144 timeslots or channels to appear sequentially at the read data output bus 358. However, it is desired to only unload all 144 tribits from a single symbol during one symbol time, so some switching on the output bus is needed, as described below.

A tribit select counter which is not shown in FIG. 12 coupled with a multiplexer 356 does this switching. This tribit select counter generates a tribit select signal on line 354 in FIG. 12 which controls switching by a multiplexer 356. This multiplexer has an input coupled to the 9-bit read data output port 358 of the memory 300. The tribit select counter counts at a rate to generate the select signal on line 354 in such a way as to cause only tribits from the first symbol to be output from the multiplexer 356 on bus 360 during the time that first symbol is being transmitted.

Figure 20:
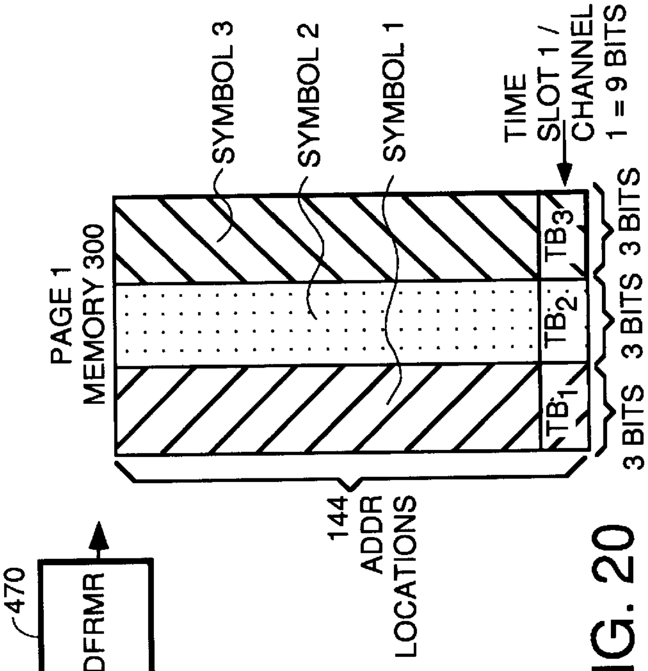
FIG. 20 is a diagram which helps illustrate the manner in which framer memory 300 is emptied for transmission.

FIG. 20 is a diagram which helps illustrate the manner in which framer memory 300 is emptied for transmission. FIG. 20 shows a completely filled page 1 of memory 300 in FIG. 12 comprising 144 memory addresses, each filled with one 9-bit byte, and divided into three columns of 3-bit tribits. Each column, marked by the legends symbol 1, symbol 2 and symbol 3, is comprised of 144 tribits and represents one symbol of a frame. To send this frame of data, the read pointer will increment 144 times during the time the first symbol is being encoded. The state of the tribit select counter during this first 144 cycles is such that only the 144 tribits of symbol 1 will be output on bus 360 to the ECC encoder 402.

After the 144th incrementation, the read pointer counter 324 rolls over to zero and begins to count up to 143 again. At the 144th incrementation, the tribit select counter increments which causes the multiplexer 356 to select the middle column of tribits from symbol 2 in FIG. 20 for output on bus 360 in FIG. 12 to the ECC encoder 402 in FIG. 19. A similar process unloads the 144 tribits of symbol 3.

Bus 360 in FIG. 12 is coupled to ECC encoder 402 in FIG. 19. The ECC encoder is a state machine which, in conjunction with state memory 404, receives the stream of tribits and calculates a 4th ECC bit for each tribit. This 4th bit provides redundancy for error detection and correction and for use by a Viterbi decoder in the receiver in ascertaining with greater accuracy the data that was actually sent despite the presence of noise.

The stream of 4-bit symbol elements that are output from the ECC encoder 402 are stored in memory 406 as three different linear arrays corresponding to symbols 1, 2 and 3 in FIG. 20.

A multiplexer 362 having its output coupled to the address input of the framer memory 300 has two inputs: one is coupled to the output of the read pointer counter 324 and the other is coupled to the output of the write pointer counter 322. This multiplexer alternately couples the read pointer on bus 364 and the write pointer 366 to the address port 368 of the memory 300 on every cycle of the chip clock signal on line 348. The chip clock signal is also coupled to the control input of the memory 300 to serve as the RD/WR* control signal controlling whether the memory uses the address at port 368 in a read or a write transaction.

Returning to the consideration of FIG. 19, the output data streams from the framer on bus 360 may optionally be passed through an ECC encoder to add redundancy by calculating a 4th ECC bit for each tribit. In the preferred embodiment, the ECC encoder is used to provide greater accuracy and better noise immunity. The ECC encoder, in the preferred embodiment, is a state machine but it could also be a lookup table. For purposes of this discussion, it will be assumed that the ECC encoder is present.

Figures 21, 22:
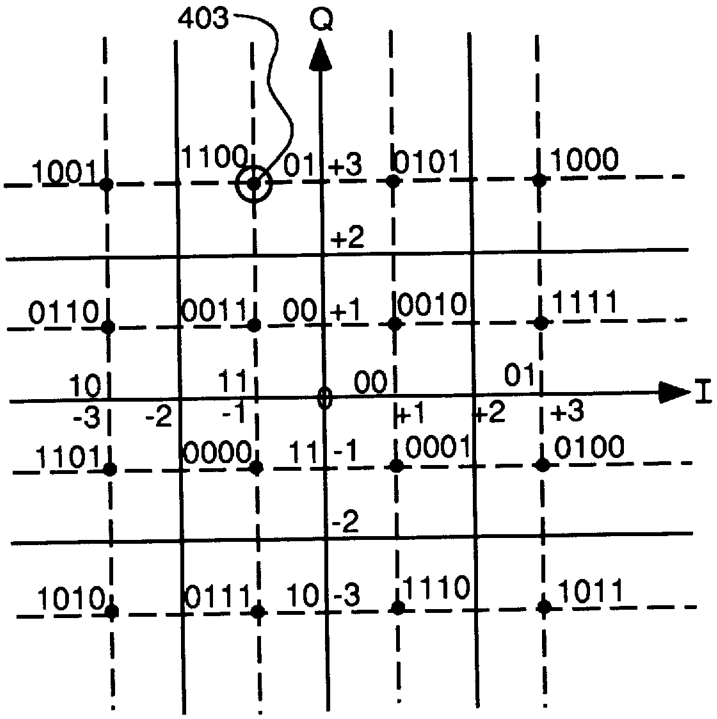
FIG. 21 maps each of 16 possible input points, i.e., permutations of the 4 bits in each symbol array to a point in space defined by the in-phase or I axis for the real part and the quadrature or Q axis for the imaginary part of each point.
FIG. 22 is a table listing all the possible 16 combinations of 4 bits in the Code column and the corresponding 2's complement digital representation of the real and imaginary coordinates for each combination in the Inphase and Quadrature columns, respectively.

The output of the ECC encoder is an array of 4-bit digital numbers for each of symbols 1, 2 and 3. Each of these 4-bit numbers has two bits representing a real part and two bits representing an imaginary part. This convention is used to facilitate the constellation of input point mappings shown in FIG. 21. FIG. 21 maps each of 16 possible input points, i.e., permutations of the 4 bits in each symbol array to a point in space defined by the in-phase or I axis for the real part and the quadrature or Q axis for the imaginary part of each point. FIG. 22 is a table listing all the possible 16 combinations of 4 bits in the Code column and the corresponding 2's complement digital representation of the real and imaginary coordinates for each combination in the Inphase and Quadrature columns, respectively. For example, the input point 1100 maps to a point having a +3 imaginary coordinate and a −1 real coordinate on the constellation of FIG. 21. The mapping of FIG. 21 was selected to give maximum separation between points in the constellation for best noise immunity, but any other mapping would also work. Likewise, 2's complement representation is not required for the coordinates as they can be represented in other number systems as well.

After passing the tribit stream from the framer 400 through the ECC encoder, the resulting 4-bit data streams are stored as separate arrays for each symbol in memory 406. Each symbol is comprised of two linear arrays of 2 bit numbers: one array contains multiple 2-bit elements defining the real or inphase coordinates for all the elements of the symbol and the other array stores the 2-bit elements which define the imaginary or quadrature coordinate of each symbol element. The 144 array elements of each symbol define an information vector b for each symbol.

Figure 23:
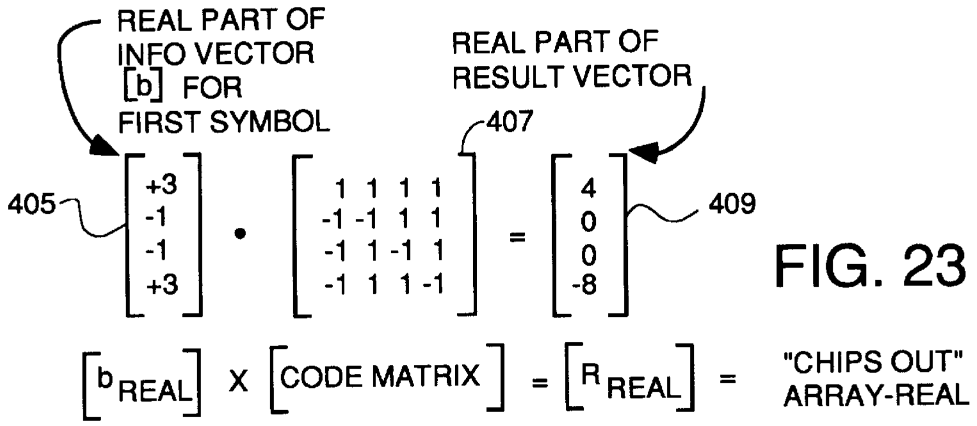
FIG. 23 is an illustration of the matrix multiplication process carried out in encoder 402 in FIG. 19 to encode each symbol using an orthogonal code matrix.

FIG. 23 shows the matrix multiplication process which is performed within code division multiplexer 408 in FIG. 19 to multiply each of the two linear arrays that define each symbol times the orthogonal code matrix [c]. In the preferred embodiment, the matrix multiplication is performed by a microprocessor, but any machine that can do the matrix multiplication will suffice to practice the invention.

The encoding in CDMA Mux 408 using the orthogonal or orthogonal, cyclic codes is done in two steps. First, a linear array information vector of just real or inphase coordinates of the symbol to be transmitted, symbolized by array 405 in FIG. 23, is multiplied by the code matrix 407. This operation generates another linear array of real or inphase coordinates along the R axis of a result space in a results constellation similar to the constellation of all possible input points shown in FIG. 21. This first linear array 409 defines the real axis coordinates in the result constellation for a plurality of chips from the first symbol to be transmitted.

Second, the same process is repeated for the imaginary coordinate linear array (not shown) for the same symbol the real coordinates of which were just processed. This results in another linear array comprising the imaginary or quadrature coordinates of the chips in the results array. This imaginary component array of the results array also is not shown in FIG. 23.

The real component array, represented by linear array 409, is part of an overall result or "chips out" array which contains both the real and imaginary coordinates of a plurality of chips to be transmitted. These chips map to points in the result space, and the points in the result space map to whatever points in the input point space that are defined by the real and imaginary components in the information vector array b, of which array 405 is the real part. The mapping between the input point space and the results space is defined by the contents of the code matrix and the orthogonal codes.

Before performing the matrix multiplication, the 2's complement values of the real and imaginary components of the information vector b input array are converted to their decimal equivalents as shown in FIG. 23. FIG. 23 is a simplified version of the system in which there are only 4 channels resulting in 4 elements of each symbol. The 4 real components of the information vector b shown in array 405 after conversion to their decimal equivalents, are, respectively, +3, −1, −1 and +3. This column of numbers is multiplied by the first row in the code matrix to yield the result 4 as the first real component in array 409 of the results array. This result is derived from summing the partial products as follows $[(3\times1)+(-1\times1)+(-1\times1)+(3\times1)]=4$. The next component down in the real part array 409, i.e., 0, is derived by multiplying the next real component down in the array 405 times the second row of the code matrix in a similar manner yielding $[(-1\times-1)+(-1\times-1)+(-1\times1)+(-1\times1)]=0$. In the preferred embodiment, arrays 405 and 409 would be 144 elements long, and the code matrix 407 would have 144 elements in each row and would have 144 rows.

The resulting real and imaginary component linear arrays of the results or chips out array are stored in a memory within the CDMA Mux 408 which is not separately shown. The components of these two arrays are then output on separate I and Q buses to a modulator 410 where they are used to amplitude modulate the amplitudes of two RF carriers that are 90 degrees out of phase. The resulting two AM carriers are summed and output on the shared transmission media 412. This is done as illustrated in FIG. 24.

Figure 24:
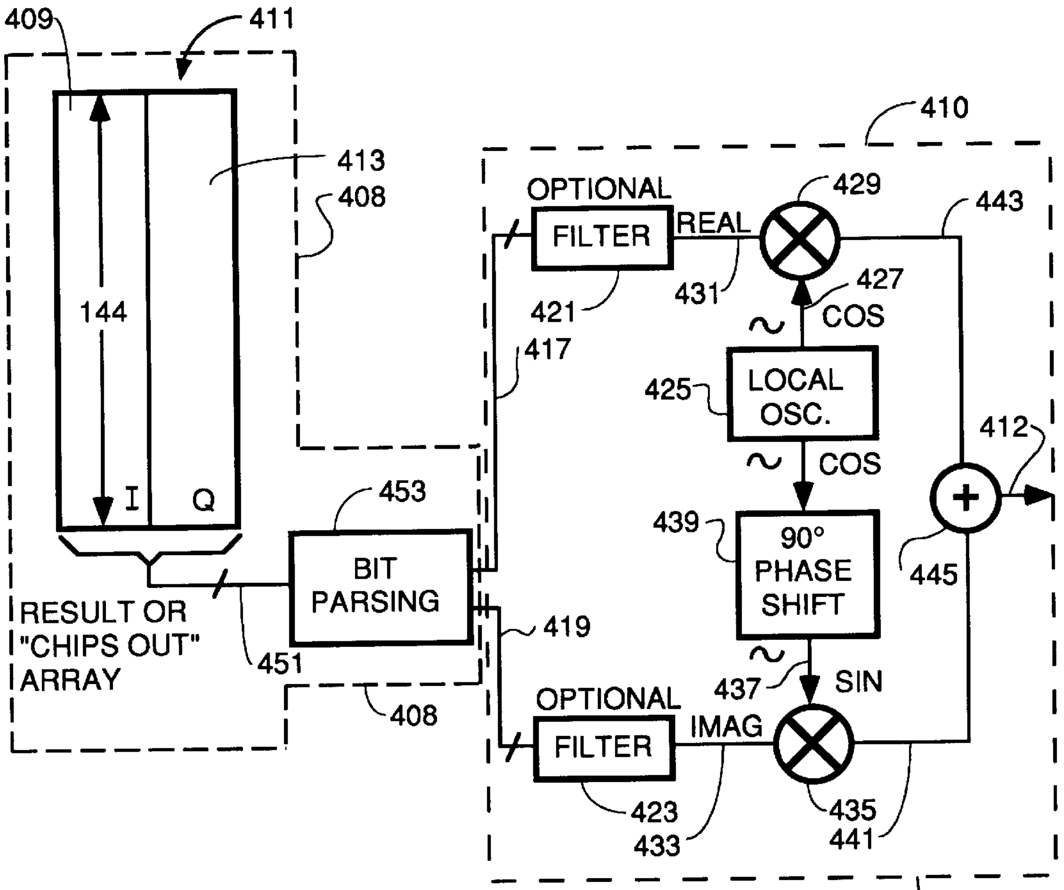
FIG. 24 is a block diagram illustrating more details of the components and operation of the multiplexer 408 and the modulator 410.

Referring to FIG. 24, more details of the coordination of the multiplexer 408 and the modulator 410 are illustrated.

The result or chips out array 409 and 413 are stored in memory 411 within the CDMA Mux 408, and comprises the real or inphase array 409 and the imaginary or quadrature array 413 of the 144 result points or chips in the result space. On every chip clock, one result point or chip comprising a real component and an imaginary component is output on bus 451 to a bit parsing unit or bit splitter 453. The bit parsing unit 453 splits off the real component and outputs those bits on bus 417. The imaginary component will be parsed out, and those bits will be output on bus 419.

Figure 25:
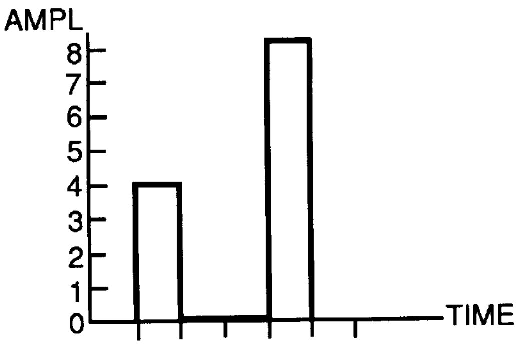
FIG. 25 which is a plot of the changes in amplitude over time of the real components of the results vector for the array 409.

Because the RF signals that carry the information from the 144 channels must share the transmission media with other RF signals having adjacent frequencies, two optional digital passband filters 421 and 423 are used to limit the bandwidth of the signals on buses 417 and 419 to 6 Mhz to avoid interference with signals on neighboring frequencies. The digital signals on buses 417 and 419, when converted to their decimal equivalents, usually have rapid transitions between levels in adjacent intervals. This is illustrated in FIG. 25 which is a plot of the changes in amplitude over time of the real components of the results vector for the array 409. These filters 421 and 423 are low pass filters which remove high frequency Fourier components caused by sharp edges in such signals which effectively round off corners of such signals and limit most of the power density in the Fourier spectrum of such signals to a 6 Mhz band centered around the frequency of the RF carrier generated by local oscillator 425. This local oscillator generates a sine wave, RF carrier at a frequency selected to be compatible with the switching rate of multiplexer 408 and to not interfere with existing cable TV service signals on adjacent frequencies.

The local oscillator cosine wave is applied to the carrier input 427 of an amplitude modulator 429 which also receives the filtered real component of each chip on bus 431. The modulator 429 modifies the amplitude of the carrier signal on line 427 in accordance with the amplitude of the decimal equivalent the real component on bus 431 and outputs the result on bus 443.

The imaginary or quadrature component of each chip, after filtering, is input on bus 433 to another amplitude modulator 435. This modulator receives at a carrier input 437 a sine wave of the same frequency as the cosine wave on line 427, but shifted in phase by 90 degrees by phase shifter 439. Modulator 435 modifies the amplitude of the sine wave in accordance with the amplitude of the imaginary component on bus 433, and outputs the result on line 441. Lines 441 and 443 are coupled to a summer 445 which sums the two waveforms and outputs them on the shared transmission media via line 412.

In some embodiments, the line 412 may be coupled to suitable interface circuitry to drive the signal on line 412 into a wireless or cellular system, a terrestial microwave link, a coaxial cable of a cable TV, telephone or other system, a fiber optic link of a cable TV, telephone or other system, a local area or wide area network or any other media developed in the future for real time communication of data. Such interface circuitry is known and will not be described further herein.

Figure 26:
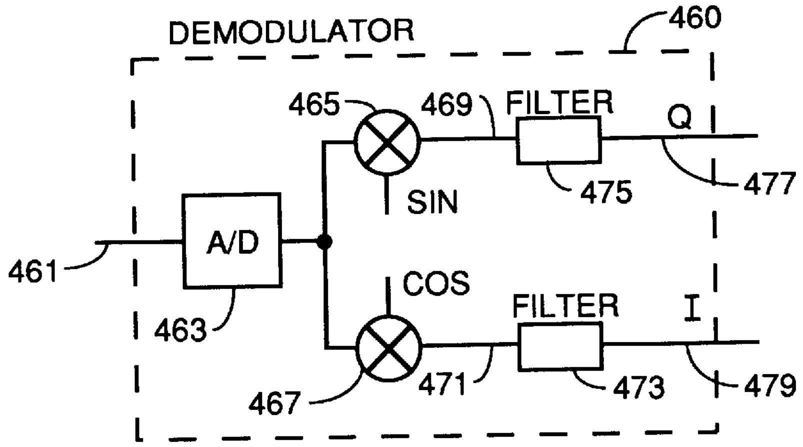
FIG. 26 is a more detailed diagram of the structure of the demodulator in the receive channel.

Returning to the consideration of FIG. 19, the receiver side circuitry of the transceiver will be described in more detail. As is the case with the transmit channel, the processing performed in the receiver may be performed using analog or digital or some combination of analog and digital circuitry. The receiver will be described as if all processing was digital as it is in the preferred embodiment. The signal received from the shared transmission media is passed through an analog-to-digital converter (not shown) and the resulting digital data stream is passed to a demodulator 460. FIG. 26 is a more detailed diagram of the structure of the demodulator. The received analog signal from the shared transmission media is coupled on line 461 to the analog input of an A/D converter 463. The stream of digital data is simultaneously fed to two multipliers 465 and 467. Multiplier 465 receives as its other input, a stream of digital values that define a sine wave having the same frequency as the RF carrier sine wave on line 437 in FIG. 24. Multiplier 467 receives as its other input, a stream of digital values that define a cosine wave having the same frequency as the RF carrier cosine wave on line 427 in FIG. 24. The results output on lines 469 and 471 is a digital data stream which basically defines the mix products comprised of a fundamental carrier frequency and upper and lower sidebands. Digital filters 473 and 475 filter out the desired sidebands that contain the real and imaginary parts of each chip or result point that was transmitted. The stream of quadrature or imaginary components of the received chips are output on bus 477. The stream of inphase or real components of the received chips are output on bus 479.

In some embodiments, the streams of real and imaginary components of the 144 chips of each symbol on buses 477 and 479 are stored in two linear arrays in CDMA Demultiplexer 462 in FIG. 19. The CDMA Demultiplexer 462 multiplies each of the real and imaginary component arrays times the transpose of the code matrix used by the CDMA Mux 408 of whatever RU or CU that transmit the data to reverse the orthogonal code encoding process. This matrix multiplication process results in two linear arrays of decoded chip real and imaginary parts for each symbol. These arrays are stored by the CDMA demultiplexer 462 in memory 464. In alternative embodiments, the CDMA Demultiplexer processes the two streams if real and imaginary components "on the fly" such that they do not have to be first stored as input arrays in a memory in the CDMA Demultiplexer 462.

After the linear arrays of real and imaginary received data point components for a symbol are stored in memory 464, the result for each symbol is an array of received data points in a received data point space having a real axis and an imaginary axis. The received data point space is the same data space as is shown in the constellation of FIG. 21, and can have the same data points in it although the received data points usually do not have the same coordinates as the input data points that were transmitted because of the phase and amplitude errors imposed on the received data points by channel impairments. A detector 466 examines the points in each of the arrays and compares the received data points they define against the legitimate possible points in the constellation of input points in the input data point space of FIG. 21. The detector, othewise known as a slicer, is a known type of circuit and no further details are necessary herein. The function of the detector is to compare each received data point and compare each point against the closest points in the constellation of legitimate possible input data points that could have been transmitted. The detector then makes a preliminary decision as to which of the possible legitimate input data points in the constellation each received data point is likely to be.

The detector 466 then outputs its preliminary determinations to a Viterbi decoder 468. Viterbi decoders are well known in the art of digital communications, and no further details will be given here except to state its function. The Viterbi decoder uses the 4th ECC bit in each 4 bit component of each symbol to detect and correct errors. This is done by performing the Viterbi algorithm to derive the most probable tribit path defined by the points actually sent from the path in the received chip space defined by the 4-bit components of the symbols actually received, after they have been processed by the detector. This Viterbi algorithm could be carried out by a programmed digital computer or by a dedicated hardware circuit.

The output data points from the Viterbi decoder are a stream of tribits. These tribits are stored in a memory in a deframer circuit 470 which functions to reassemble a replica of the TDMA data stream in the time domain from the incoming stream of chips or tribits comprising each symbol. This process is done by reversing the reading and writing processes described above in filling and emptying the framer memory 300 of FIG. 14.

Although the teachings of the invention have been presented herein in terms of a few preferred and alternative embodiments, those skilled in the art will appreciate numerous modifications, improvement and substitutions that will serve the same functions without departing from the true spirit and scope of the appended claims. All such modifications, improvement and substitutions are intended to be included within the scope of the claims appended hereto.

I claim:

1. A process for transmitting multiple channels of digital data in distributed systems having multiple units coupled by a shared transmission media by using synchronous code division multiple access, comprising:

receiving a time division multiplexed digital data stream comprised of N time slots or channels, each of which contains one or more bits of digital data;

reorganizing the digital data from said N time slots into a frame containing M consecutive symbols, each said symbol containing an element from each time slot, each element having at least one bit;

spreading the spectrum of each said symbol by doing matrix multiplication to multiply an information vector having as elements said elements of said symbol by a code matrix embodying N orthogonal spreading codes to generate a resulting chips out array;

using the chips of the resulting chips out array to modulate at least one radio frequency carrier in successive intervals according to the amplitude represented by successive corresponding chips of the chips out array;

transmitting said at least one modulated radio frequency carrier on said shared transmission media.

2. The process of claim 1 wherein said spreading of the spectrum of each said information vector comprises multiplication of said information vector by a code matrix embodying N orthogonal, cyclic spreading codes.

3. A process for receiving modulated signals created in a transmitter by using multiple channels of digital data from a time division multiplexed input data stream which are reorganized into a frame of data containing a plurality of symbols, each said symbol organized as an information vector having a plurality of elements and having its spectrum spread using orthogonal codes embodied in a spreading code matrix to generate an array of chips for each said information vector, the resulting spread spectrum chip data being transmitted over a shared transmission media by modulating at least one radio frequency carrier using the resulting spread spectrum data to generate modulated signals, and reconstructing therefrom a time division multiple access data stream which is a replica of the time division multiplexed input data stream which was used to create said modulated signals in said transmitter, comprising:

demodulating the modulated signals received from said shared transmission media to generate signals which are organized into a plurality of received information vectors, each said received information vector representing the spread spectrum received version of the chips of the information vector representing a symbol in a frame of digital data transmitted by said transmitter;

performing a matrix multiplication to multiply each received information vector by the transpose of said orthogonal spreading code matrix used to spread the spectrum of each said information vector for transmission over said shared transmission media so as to generate a result matrix for each said received information vector, each said result matrix comprising a plurality of elements;

electronically comparing each element in each said result matrix against a constellation of legitimate possible data points that could have been transmitted and making a judgment as to which of said points in said constellation of legitimate possible data points that each said element probably was before it was corrupted by noise and losses during transmission; and reorganizing the probable data points from the constellation of legitimate possible data points assigned to the elements of all said result matrices into a time division multiplexed data stream which is a replica of said time division multiplexed data stream which was used to create said received modulated signals.

4. A process for transmitting multiple digital data streams in a distributed system having multiple remote units located at different locations in said distributed system coupled by a shared transmission media to a central unit using synchronous code division multiple access multiplexing, comprising:

receiving N digital data streams throughout said distributed system using said plurality of remote units, each of said digital data streams containing one or more bits of digital data, each said remote unit receiving only a portion of said N digital data streams;

in each remote unit, reorganizing the digital data from the digital data streams received thereby into multiple frames, each frame containing M consecutive symbols followed by a guardband, each said symbol containing at least N elements corresponding to said N digital data streams with only those elements corresponding to the particular digital data streams received by this particular remote unit containing any data from the corresponding digital data stream(s) received by this particular remote unit;

in each said remote unit, spreading the spectrum of each said symbol by doing matrix multiplying the elements of an information vector representing the elements of said symbol by a code matrix embodying N orthogonal codes, each orthogonal code having N elements to generate a result vector for each symbol, each said result vector having N elements;

using each of the N elements of the result vector to modulate a radio frequency carrier in one of N successive intervals according to the amplitude represented by the particular one of said N elements corresponding to said interval to generate RF signals representing N constellation points, said RF signals transmitted in said frames;

in each remote unit, performing a ranging process whereby each remote unit cooperates with said central unit to find the propagation time of signals from it to said central unit and thereafter, in each remote unit, setting a transmit frame timing delay so as to cause a frame of RF signals transmitted by each remote unit to arrive with its frame boundaries aligned in time with the frame boundaries of frames transmitted by each other remote unit so as to achieve frame synchronization despite differences in propagation delay between each said remote unit and said central unit; and transmitting on said shared transmission media from each said remote unit said frames of RF signals using the transmit frame timing delay determined by that remote unit to cause frame synchronization at said central unit of that remote unit's frames with frames transmitted by all said other remote units.

5. The process of claim 4 wherein said ranging process step comprises the steps of adjusting by trial and error said transmit frame timing delay and then transmitting a unique code which can be detected by said central unit, said trial and error adjustment of said transmit frame timing delay continuing at various values of delay until said unique code arrives at said central unit during said guardband, and, when this occurs, holding said transmit frame timing delay steady at the value which caused said unique code to arrive during said guardband thereby achieving frame synchronization with all the other remote units which have performed the ranging process.

6. The process of claim 5 further comprising the steps of fine tuning said transmit frame timing delay at each remote unit by communications between each said remote unit and said central unit so as to exactly center said unique code in said guardband so as to minimize crosstalk at said central unit between symbols transmitted from different remote units.

7. The process of claim 4 wherein said step of receiving N digital data streams comprises the step in each remote unit of receiving a time division multiplexed digital data stream having N timeslots, and wherein said central unit assigns particular ones of said timeslots to each remote unit by messages to said remote units, and wherein said step of reorganizing said digital data in each remote unit comprises the steps of taking at least a portion of the data bits from each timeslot in said time division multiplexed data stream assigned to the remote unit by the central unit and encoding said data bits in an error correcting code encoder to add one or more redundant bits useful for error detection and correction by a Viterbi decoder, and using the resulting collection of data bits plus redundant bits corresponding to one or more timeslots assigned to said remote unit as one or more elements in a symbol corresponding to the timeslot from which the data bits encoded by the error correcting code encoder came.

8. The process of claim 7 wherein the step of spreading the spectrum of each said symbol by performing matrix multiplication comprises the steps of dividing the data bits plus the redundant bits of each symbol element into two portions so as to generate two information vectors for each symbol, one information vector designated the inphase or I information vector and the other designated the quadrature or Q information vector, and thereafter separately matrix multiplying each of the I and Q information vectors by said code matrix so as to generate I and Q result vectors having N elements, and wherein the step of using the result vectors to modulate a radio frequency carrier comprises the steps of using the elements of the I result vector to modulate a first radio frequency carrier and using the elements of said Q result vector to modulate a second radio frequency carrier and thereafter summing the resulting radio frequency signals for transmission on said shared transmission media, and wherein said first and second radio frequency carriers have the same frequency but are 90 degrees out of phase with each other.

9. An apparatus for transmitting multiple channels of digital data from a plurality of remote units to a central unit over a transmission media using synchronous code division multiple access multiplexing, comprising:

a framer in each remote unit coupled to receive incoming data of a time division multiple access stream comprised of N timeslots, hereafter referred to as channels, only selected ones of said channels being currently assigned to each said remote unit, each said channel containing one or more bits of digital data, said framer also for interleaving the data of said N channels over a frame comprised of M contiguous symbols and a guardband during which no data from said time division multiple access stream is transmitted, said interleaving being carried out by reorganizing said data from said N channels into M information vector arrays, each comprised of a plurality of elements, each element comprising a subgroup of bits from one channel of said time division multiple access stream;

an error correcting code encoder in each remote unit for receiving said M information vector arrays of each frame and encoding each element with one or more redundant bits for use in error detection and correction so as to generate M encoded information vector arrays for each frame;

a memory in each remote unit for storing said M encoded information vector arrays for each frame;

a code division multiplexer in each remote unit for receiving said M encoded information vector arrays of each frame and performing code division multiple access spreading by matrix multiplying each of said M information vector arrays by a code matrix comprising N orthogonal, cyclic codes, each code having N elements, said code division multiplexer generating M encoded result vectors, each having N elements;

a modulator in each remote unit coupled to said transmission media and coupled to receive said M encoded result vectors said modulator functioning to use said result vectors to modulate one or more radio frequency carrier signals to generate modulated RF signals representing each frame, and for transmitting said modulated RF signals over said transmission media;

a transmit frame timing delay adjustment circuit included within said framer circuit in each said remote unit for adjusting a transmit frame timing delay which alters timing of transmission to said central unit from each said remote unit of said modulated RF signals representing said M encoded symbols of each frame generated in said remote unit such that said modulated RF signals representing each transmitted frame from each remote unit arrive at said central unit simultaneously regardless of differences in propagation time between each different remote unit and said central unit.

10. The apparatus of claim 9 further comprising a bit parsing circuit coupled to receive each of said M encoded result vectors of each frame and divide the bits of each element of each result vector into an inphase component and a quadrature component, and wherein said modulator receives the inphase and quadrature components and uses the inphase component to modulate a first radio frequency carrier and uses the quadrature component to modulate a second radio frequency carrier and sums the resulting modulated RF signals for transmission over said transmission media, wherein said first and second radio frequency carriers have the same frequency but are separated in phase by 90 degrees.

11. The apparatus of claim 10 wherein said transmission media is a cable television hybrid fiber coaxial cable network, and further comprising filters coupled to filter said inphase and quadrature components so as to limit the bandwidth of the Fourier spectrum of said inphase and quadrature components to a 6 mHz band centered on a frequency selected so as to not interfere with any cable television programs being simultaneously broadcast over said cable television network.

12. A receiver for receiving multiple channels of digital data transmitted from a plurality of remote units to a central unit over a transmission media, comprising:

an analog-to-digital converter coupled to receive modulated RF signals from said transmission media representing data from said multiple channels of digital data which have been encoded with redundant error detection and correction data and code division multiplexed onto a single frequency carrier, said analog-to-digital converter functioning to convert said modulated RF signals into a plurality of digital samples;

a demodulator coupled to receive said plurality of digital samples and multiply them by digital representations of first and second local oscillator signals that are matched in frequency and phase with first and second radio frequency carrier signals which comprise said RF signals received from said transmission media so as to generate a plurality of inphase and quadrature arrays which represent code division multiplexed versions of said multiple channels of digital data;

a demultiplexer for receiving said inphase and quadrature arrays from said demodulator and multiplying said arrays by the transpose of a spreading code matrix used to code division multiplex the multiple channels of data so as to generate inphase and quadrature arrays of demultiplexed received data which define the phase and amplitude of a plurality of received data points in a two dimensional constellation of possible legitimate data points that could have been transmitted;

a memory for storing said inphase and quadrature arrays of demultiplexed received data;

a slicer detector for receiving said inphase and quadrature arrays of demultiplexed received data and comparing the received data points represented thereby to one or more of the data points in the constellation of possible legitimate data points that could have been transmitted, said slicer detector for generating preliminary determination data representing rough estimates as to which of the possible legitimate data points that could have been transmitted each received data point most likely corresponds;

a Viterbi decoder for receiving said preliminary determination data and using said redundant error detection and correction data encoded into said received data points and using received data point data stored in said memory to detect and correct errors between the phase and amplitude of each actual received data point and the phase and amplitude of the legitimate data points to which said received data point corresponds, said Viterbi decoder for outputting the legitimate data points which were transmitted and which represent said multiple channels of digital data.

13. A communication system comprised of a central unit coupled by a transmission medium to a plurality of distributed remote units wherein each remote unit sends data to said central unit via code division multiple access multiplexing to establish one or more virtual channels through said transmission medium, each virtual channel appearing to the remote unit to be an unshared transmission medium coupling that remote unit to said central unit, each said virtual channel establishing by encoding data from that remote unit using a spreading code assigned to that remote unit by said central unit, each remote unit being assigned to one or more virtual channels on an ongoing, dynamic as-needed basis by said central unit based upon the amount of data that said remote unit has to send as communicated to said central unit by a message from said remote unit, said central unit receiving requests from said remote units for bandwidth and assigning virtual channels to said remote units on the basis of the contents of said request messages.

14. A communication system comprised of a central unit coupled by a transmission medium to a plurality of distributed remote units wherein each remote unit sends data to said central unit via code division multiple access multiplexing so as to establish one or more virtual channels through said transmission medium, each virtual channel appearing to the remote unit to be an unshared transmission medium coupling that remote unit to said central unit, each said virtual channel establishing by encoding data from that remote unit using a spreading code, and wherein said remote units establish frame synchronization such that each remote unit aligns frame boundaries of the frames of data each remote unit sends to the central unit such that all remote unit frame boundaries are aligned in time at the location of said central unit with the frame boundaries of each other remote unit, and wherein each remote unit is structured to achieve this frame synchronization by adjusting the time delay of transmission of a marker signal which indicates when in time the frame boundaries of frames from that remote unit will arrive by trial and error and monitoring transmissions from said central unit which indicate when frame synchronization has been achieved by that remote unit.

15. A process for creating interleaved symbols for use in transmitting multiple channels of digital data over a shared transmission media of a distributed system by multiplexing, comprising:

receiving a time division multiplexed digital data stream comprised of N time slots or channels, each of which contains one or more bits of digital data;

reorganizing the digital data from said N time slots into a frame containing M consecutive symbols, each said symbol containing an element from each time slot, each element having at least one bit.

16. The process of claim 15 wherein the multiple symbols are multiplexed over said shared transmission media using code division multiple access multiplexing, and wherein each time slot contains a plurality of bits of data, and wherein said reorganizing step comprises generating said interleaved symbols by storing the plurality of bits of data from each time slot in an address until a frame of addresses has been stored said frame comprising as many timeslots as there are codes in use in said code division multiple access multiplexing, and generating said interleaved symbols by subdividing each timeslot of data into as many segments as there are symbols to generate and generating the first interleaved symbol by reading the first segments from each timeslot and using them as said elements of said first symbol, and generating the second symbol by reading the second segments of each timeslot and using them as the elements of said second symbol and continuing this process until all the symbols have been generated.

17. The process of claim 15 wherein the multiple symbols are multiplexed over said shared transmission media using code division multiple access multiplexing, and wherein each time slot contains a eight bits of data to which a 9th bit is added for use in adding management and control information, and wherein said reorganizing step comprises generating said interleaved symbols by storing the nine bits of data from each time slot in an address until a frame of addresses has been stored, said frame comprising as many timeslots as there are codes in use in said code division multiple access multiplexing, and generating said interleaved symbols by subdividing each timeslot of data into three segments of three bits each and generating the first interleaved symbol by reading the first segments from each timeslot and calculating a redundant bit for each segment useful in Viterbi decoding based upon the states of the other three bits to generate a four bit element, an using all four bit elements so generated as said elements of said first symbol, and generating the second symbol by reading the second segments of each timeslot and calculating a redundant bit for each segment useful in Viterbi decoding based upon the states of the other three bits to generate a four bit element, an using all four bit elements so generated as said elements of said second symbol and continuing this process until three symbols have been generated.

18. The process of claim 17 further comprising the step of dividing each four bit element of each symbol into a real part comprising a first pair of bits and an imaginary part comprising a second pair of bits which are different than the first pair of bits to as to generate a real information vector and an imaginary information vector from each symbol, said real information vector of each symbol comprising said first pair of bits from each element of said symbol, and said imaginary information vector of each symbol comprising said second pair of bits from each element of said symbol, and further comprising the steps of spreading the spectrum of each of said real and imaginary information vectors separately by matrix multiplying each information vector by a spreading code matrix comprised of orthogonal spreading codes.

19. The process of claim 18 wherein said matrix multiplications result in real and imaginary result vectors, and further comprising the steps of QAM modulating two RF carriers of the same frequency but separated in phase by 90 degrees using said real result vector to amplitude modulate one carrier and said imaginary result vector to amplitude modulate the other carrier.

20. The process of claim 19 wherein the shared transmission media is a cable TV hybrid fiber coax network, and wherein the frequency of said first and second carriers is selected to be a frequency which will not interfere with cable TV programming carried on said media, and further comprising the step of passing a signal representing each of said real and imaginary result vectors through a bandwidth limited passband filter to limit the bandwidth of each signal to a bandwidth of 6 mHz.

21. A process for achieving frame synchronization at a central transceiver of any communication system having a plurality of distributed remote transceivers that transmit frames of data to said central transceiver, comprising:

(1) transmitting a barker code trigger signal from said central transceiver to all remote transceivers marking a time reference relative to the frame boundaries of frames transmitted by said central transceiver for each central transceiver frame, each frame having one or more symbols of payload data and a gap interval during which no payload data is transmitted;

(2) receiving said barker code trigger signal at a remote transceiver attempting to achieve frame synchronization and waiting a programmable interval before transmitting the same barker code back to said central transceiver;

(3) performing a correlation calculation between any signal received during said gap and said barker code trigger signal and sending a message to said remote transceiver if no barker code is found in the gap;

(4) if no barker code is found in the gap, changing said programmable interval at the location of said remote transceiver, and, upon receipt of another barker code trigger signal from said central transceiver, waiting said new programmable interval before transmitting said barker code back to said central transceiver;

(5) performing steps (3) and (4) until a barker code is found in said gap, and then determining how far away and in which direction said barker code received from said remote transceiver is away from the center of said gap, and sending a message to said remote transceiver telling it how much to change said programmable delay and in which direction to exactly center its barker code transmissions in the gap at said central transceiver to generate a transmit frame timing delay value to achieve frame synchronization, and, thereafter, transmitting each frame of data from said remote transceiver to said central transceiver an interval equal to said transmit frame timing delay value after receipt of a barker code trigger signal from said central transceiver, and repeating this process for each remote transceiver thereby achieving frame synchronization such that the frame boundaries of all correspondingly numbered frames transmitted by all said remote transceiver arrive at said central transceiver with their frame boundaries aligned in time.

22. The process of claim 21 wherein said barker code transmissions are relatively short and have amplitudes which are low enough so as to not cause substantial interference with payload data if they happen to arrive during the payload data portion of a frame transmitted by another remote transceiver.

23. The process of claim 21 wherein multiple remote transceivers can simultaneously, autonomously decide to attempt to achieve frame synchronization and further comprising the steps carried out by said central transceiver and remote transceivers to determine if more than one barker code has arrived during the gap, and, if so, sending messages to said remote units telling them to execute collision resolution protocols that will cause some of them to stop attempting to achieve frame synchronization, and continuing the process of monitoring the gap and sending messages until only one remote transceiver's barker code is found in the gap, and then sending a message requesting the remote transceiver to identify itself, and, after its identification is known, sending a message instructing that remote transceiver how to change it programmable delay to exactly center its barker code in said gap.

24. The process of claim 23 wherein the step of determining if more than one remote transceiver's barker code is in the gap comprises broadcasting a message indicating that activity has been found in the gap, and each remote transceiver responding by transmitting an authentication code unique to it to said central transceiver, each unique authentication code comprising the transmission of barker codes in a unique "on-off" pattern wherein barker codes are transmitted during exactly half the frames of a multiframe authentication interval, and determining if there are more than half the gaps of the authentication interval during which barker codes are received thereby indicating more than one remote transceiver is attempting to achieve frame synchronization and has successfully timed its transmission such that its barker code arrives during the gap.

25. A process of generating a time division multiple access data stream comprising putting a plurality of payload data bits in each timeslot and putting one or more additional bits in each timeslot which may be encoded with sidechannel information such as management and control information.

26. Circuitry for use in a code division multiplexed distributed communication system having a plurality of distributed remote transmitters transmitting digital data over a shared transmission media to a central unit transceiver, comprising:

first means in said central unit transceiver for assigning timeslots to said transmitter on the basis of the traffic volume it has to send and communicating the assigned timeslot(s) to said transmitter via messages on a command and control channel;

second means in each remote transmitter for placing digital data from one or more peripheral devices or processes into the timeslots assigned by said first means;

third means in each remote transmitter for receiving digital data organized as a time division multiplexed data stream having a plurality of timeslots with only those timeslots assigned to said remote transmitter having data therein;

fourth means in each remote transmitter for distributing data from each timeslot to a code division multiplexing encoder;

fifth means in each remote transmitter for code division multiplexing the data from each timeslot assigned to said remote transmitter using a different orthogonal code from a code set having as many different codes as there are timeslots in said time division multiplexed data stream; and sixth means for summing the output signals from the encoders of said fifth means.

27. A distributed communication system, comprising:

a shared transmission media;

a central unit transceiver coupled to said shared transmission media;

a plurality of remote unit transceivers coupled to said central unit transceiver via said shared transmission media, each said remote unit transceiver comprising circuitry functioning to receive digital data from one or more sources and transmitting said data to said central unit transceiver using code division multiplexing to separate data from different sources on said shared transmission media using a plurality of different orthogonal codes each of which establishes its own virtual channel to said central unit transceiver which appears to be not shared, and wherein a plurality of said virtual channels are dedicated to messages from said remote unit transceivers to said central unit transceiver requesting the award of a number of channels related to the amount of data that needs to be sent by each remote unit transceiver;

and wherein said central unit transceiver includes means for awarding channels to various remote unit transceivers via messages sent to said remote unit transceivers via one or more channels dedicated to management and control traffic, said means for awarding channels awarding said channels using a selectable one of a plurality of different methods.

28. The apparatus of claim 27 wherein said plurality of different methods of awarding channels include: fixed allocation; awards on the basis of need; reservation of one or more channels to specific remote unit transceivers with all other channels available for dynamic award to remote unit transceivers on any basis; first-come-first-served or any other method that suits the needs of the environment in which the distributed communication system is operating.

29. The apparatus of claim 27 wherein said plurality of different methods of awarding channels include: (1) a reservation scheme where the remote unit transceivers bid for channels via messages to said central unit transceiver and said means for awarding channels reserves certain channels to each of the remote unit transceivers; (2) a contention process wherein the central unit transceiver sends messages to said remote unit transceivers indicating which channels are available to all remote unit transceivers and the remote unit transceivers transmit on those channels at will with contentions detected by the central unit transceiver with contention notification messages to the remote unit transceivers in contention requesting that they enter a contention resolution protocol; (3) polling where the central unit polls each remote unit transceiver sequentially to determine how much bandwidth it needs and awards of bandwidth as needed and arbitration when the number of channels needed exceeds the number of channels available; and (4) fixed allocation of the available channels to specific remote unit transceiver, and wherein said means for awarding channels can awards channels at any particular time on the basis of any one or a combination of said plurality of different methods.

30. A digital data transmitter, comprising:

a framer circuit coupled to receive data and including circuitry to reorganize said data into symbols;

an error correction encoder functioning to add redundant data to said data of said symbols, said redundant data being calculated based upon said data of said symbols;

a code division multiplexer circuit for encoding data in said symbols from different sources using different orthogonal spreading codes to generate result vectors;

a modulator for using said result vectors to modulate a radio frequency carrier to generate frames of modulated RF signals; and frame synchronization circuitry for delaying the transmission of said frames of modulated RF signals for a predetermined interval so as to achieve frame synchronization at a predetermined location with frames of RF signals transmitted from other transmitters.

31. A digital data receiver comprising:

an analog-to-digital converter coupled to receive analog RF carrier signals from the hybrid-fiber-coax transmission media of a cable television system, said carrier signals modulated with digital data and convert RF carrier signals to digital samples;

a demodulator coupled to receive said digital samples and convert them to digital signals which define sidebands which contain the received digital data without the RF carrier information;

a code division demultiplexer coupled to receive said received digital data and structured to demultiplex it using the transpose of a code matrix used to code division multiplex the data at the point from which it was transmitted to generate at least one array of demultiplexed received data points; and a slicer circuit structured and coupled to receive said demultiplexed received data points and compare each received data point to the legitimate possible input data points in the constellation of data points that could have been transmitted and generate signals representing a preliminary determination as to which legitimate input data point each received data point probably represents.

32. The apparatus of claim 31 wherein each data point of said digital data has been encoded with redundant data bits useful to a Viterbi decoder and is transmitted in frames each data point representing data from a timeslot, and further comprising a Viterbi decoder for receiving said signals representing the preliminary determinations of said slicer circuit and using said redundant bits and said preliminary determinations and information stored in a memory as to the state of the data point from the same timeslot in previous frames to generate signals representing a final determination as to which of the legitimate input data points each received data point represents.

33. The apparatus of claim 32 wherein said digital data used to modulate said RF carrier is taken from a time division multiplexed stream received at a transmitter, and further comprising a deframer circuit structured to receive the output signals from said Viterbi decoder and reassemble a replica of said time division multiplexed stream originally received at said transmitter.

* * * * *